(12) United States Patent
Gros

(10) Patent No.: US 7,791,418 B2
(45) Date of Patent: Sep. 7, 2010

(54) SYSTEMS AND METHODS FOR COMPENSATING FOR VARIATIONS OF THE OUTPUT OF A REAL-TIME CLOCK

(75) Inventor: Richard A. Gros, Yorba Linda, CA (US)

(73) Assignee: Pentad Design, LLC, Tustin, CA (US)

( * ) Notice: Subject to any disclaimer, the term of this patent is extended or adjusted under 35 U.S.C. 154(b) by 0 days.

(21) Appl. No.: 12/340,553

(22) Filed: Dec. 19, 2008

(65) Prior Publication Data

US 2009/0160569 A1 Jun. 25, 2009

Related U.S. Application Data

(60) Provisional application No. 61/015,590, filed on Dec. 20, 2007.

(51) Int. Cl.
*H03B 5/32* (2006.01)
(52) U.S. Cl. .......................... 331/44; 331/176; 331/156
(58) Field of Classification Search ................. 331/176, 331/44
See application file for complete search history.

(56) References Cited

U.S. PATENT DOCUMENTS

| | | | |
|---|---|---|---|
| 3,428,916 A | 2/1969 | Hovenga et al. | |
| 3,560,880 A | 2/1971 | Easton et al | |
| 4,097,860 A | 6/1978 | Araseki et al. | |
| 4,380,745 A | 4/1983 | Barlow et al. | |
| 4,453,834 A | 6/1984 | Suzuki et al. | |
| 4,454,483 A | 6/1984 | Baylor | |
| 4,525,685 A | 6/1985 | Hesselberth et al. | |
| 4,616,173 A | 10/1986 | Cook et al. | |
| 4,633,422 A | 12/1986 | Brauer | |
| 4,746,879 A | 5/1988 | Ma et al. | |
| 4,906,944 A | 3/1990 | Frerking | |
| 4,910,473 A | 3/1990 | Niwa | |
| 4,922,212 A | 5/1990 | Roberts et al. | |
| 4,949,055 A | 8/1990 | Leitl | |
| 5,081,431 A | 1/1992 | Kubo et al. | |
| 5,392,005 A | 2/1995 | Bortolini et al. | |
| 5,412,624 A | 5/1995 | Yocom | |
| 5,548,252 A | 8/1996 | Watanabe et al. | |
| 5,771,180 A | 6/1998 | Culbert | |
| 5,781,073 A | 7/1998 | Mii | |
| 5,875,388 A | 2/1999 | Daughtry, Jr. et al. | |
| 5,892,408 A | 4/1999 | Binder | |
| 6,086,244 A | 7/2000 | Yin | |
| 6,124,764 A | 9/2000 | Haartsen et al. | |
| 6,141,296 A | 10/2000 | Progar | |
| 6,160,458 A | 12/2000 | Cole et al. | |
| 6,304,517 B1 | 10/2001 | Ledfelt et al. | |
| 6,487,668 B2 | 11/2002 | Thomas et al. | |
| 6,545,550 B1 | 4/2003 | Frerking | |

(Continued)

FOREIGN PATENT DOCUMENTS

JP 363240107 A 10/1988

(Continued)

*Primary Examiner*—Joseph Chang
(74) *Attorney, Agent, or Firm*—Vista IP Law Group LLP; William A. English

(57) ABSTRACT

Method and systems are provided for adjusting real-time clocks to compensate for frequency offset, temperature effects, and/or aging effects.

15 Claims, 25 Drawing Sheets

(Offset Compensation)

U.S. PATENT DOCUMENTS

| | | |
|---|---|---|
| 6,630,872 B1 | 10/2003 | Lanoue et al. |
| 6,661,302 B1 | 12/2003 | Rathore et al. |
| 6,729,755 B1 | 5/2004 | Yin |
| 6,885,254 B2 | 4/2005 | Kranz |
| 6,961,287 B2 | 11/2005 | Jung |
| 7,010,714 B1 | 3/2006 | Tester |
| 7,032,121 B2 | 4/2006 | Radcliffe |
| 2002/0158693 A1 | 10/2002 | Soong et al. |
| 2002/0177267 A1* | 11/2002 | Beer et al. ............ 438/200 |
| 2004/0181704 A1 | 9/2004 | Gauthier et al. |
| 2007/0079166 A1 | 4/2007 | Okada et al. |

FOREIGN PATENT DOCUMENTS

| | | |
|---|---|---|
| JP | 406082577 A | 3/1994 |

* cited by examiner (Offset Compensation)

300

32771.990629 Hz

Integer Portion ($\iota$) 310

Non-Integer Portion ($\eta\iota$) 320

405  Determine actual output or frequency of oscillator

410  Count first number (a) of "$\iota$" oscillations

415  Count second number (b) of "$\eta\iota$" oscillations

Figure 4

First number (a) of "ι" oscillations

Second number (b) of "ι + x" oscillations, e.g. (x=1)

"8" = 32768 Oscillations

"9" = 32769 Oscillations

→ 32768
→ 32769
→ 32768
→ 32769
→ 32768
→ 32769
→ 32768
→ 32769
→ 32769
→ 32769

"Alternating"

a = 4
b = 6

EOC = 32768.6 Hz

"Dithering"
Or
"Interleaving"

Figure 9

|  | 1010 | 1020  1022 |  |
|---|---|---|---|
|  | (ι)<br>Integer | Fraction (+.6) |  |
| 1010a | 32768 | 0 (1020a) |  |
| 1010b | 32768 | 6 (1020b) | Carry Out |
| 1010c | 32769 | 2 (1020c) |  |
| 1010d | 32768 | 8 (1020d) | Carry Out |
| 1010e | 32769 | 4 (1020e) | Carry Out |
|  | 32769 | 0 |  |
|  | 32768 | 6 | Carry Out |
|  | 32769 | 2 |  |
|  | 32768 | 8 | Carry Out |
|  | 32769 | 4 |  |

Figure 10

| Accumulator Integer | Accumulator Fraction | New Dither Count |
|---|---|---|
| 0 | 0 | 0 |
| 32771 | 26905 | 32771 |
| 0 | 26905 | 0 |
| 32771 | 53810 | 32771 |
| 0 | 53810 | 0 |
| 32772 | 15179 | 32772 |
| 0 | 15179 | 0 |
| 32771 | 42084 | 32771 |
| 0 | 42084 | 0 |
| 32772 | 3453 | 32772 |
| 0 | 3453 | 0 |
| 32771 | 30358 | 32771 |
| 0 | 30358 | 0 |
| 32771 | 57263 | 32771 |
| 0 | 57263 | 0 |
| 32772 | 18632 | 32772 |
| 0 | 18632 | 0 |
| 32771 | 45537 | 32771 |
| 0 | 45537 | 0 |
| 32772 | 6906 | 32772 |
| 0 | 6906 | 0 |
| 32771 | 33811 | 32771 |
| 0 | 33811 | 0 |
| 32771 | 60716 | 32771 |
| 0 | 60716 | 0 |
| 32772 | 22085 | 32772 |
| 0 | 22085 | 0 |

Figure 13

| | 1601 | 1602 | 1603 | 1604 | 1605 | 1606 |
|---|---|---|---|---|---|---|
| | °C | Measured Frequency | Generic Frequency | PPM Error Generic Formula 20 | Curve Fit Frequency | PPM Error |
| | -40.6 | 32763.427836 | 32763.001764 | -13.00 | 32763.34469 | -2.54 |
| | -35.4 | 32764.166349 | 32763.774669 | -11.95 | 32764.08903 | -2.36 |
| | -30.1 | 32764.808542 | 32764.496791 | -9.51 | 32764.78229 | -0.80 |
| | -24.8 | 32765.402176 | 32765.152640 | -7.62 | 32765.40952 | 0.22 |
| | -19.5 | 32765.919598 | 32765.742216 | -5.41 | 32765.97072 | 1.56 |
| | -14.5 | 32766.377080 | 32766.237668 | -4.25 | 32766.43964 | 1.91 |
| | -9.4 | 32766.797818 | 32766.682266 | -3.53 | 32766.85739 | 1.82 |
| | -4.1 | 32767.164887 | 32767.079276 | -2.61 | 32767.22675 | 1.89 |
| | 1.0 | 32767.463221 | 32767.398737 | -1.97 | 32767.51984 | 1.73 |
| | 6.0 | 32767.705132 | 32767.652361 | -1.61 | 32767.74783 | 1.30 |
| | 11.0 | 32767.884747 | 32767.847003 | -1.15 | 32767.91706 | 0.99 |
| | 16.2 | 32768.009601 | 32767.986862 | -0.69 | 32768.03072 | 0.64 |
| | 21.1 | 32768.069817 | 32768.060272 | -0.29 | 32768.07966 | 0.30 |
| | 26.0 | 32768.078214 | 32768.077034 | -0.04 | 32768.07217 | -0.18 |
| | 30.7 | 32768.027082 | 32768.039887 | 0.39 | 32768.01196 | -0.46 |
| | 36.0 | 32767.915016 | 32767.935477 | 0.62 | 32767.88177 | -1.01 |
| | 41.2 | 32767.737652 | 32767.768627 | 0.95 | 32767.68987 | -1.46 |
| | 46.1 | 32767.505928 | 32767.553023 | 1.44 | 32767.45088 | -1.68 |
| | 51.4 | 32767.193776 | 32767.256047 | 1.90 | 32767.12884 | -1.98 |
| | 56.4 | 32766.824921 | 32766.915128 | 2.75 | 32766.76451 | -1.84 |
| | 61.7 | 32766.374418 | 32766.489358 | 3.51 | 32766.31417 | -1.84 |
| | 66.6 | 32765.874984 | 32766.036762 | 4.94 | 32765.83907 | -1.10 |
| | 71.8 | 32765.300005 | 32765.494502 | 5.94 | 32765.27317 | -0.82 |
| | 77.0 | 32764.629838 | 32764.888446 | 7.89 | 32764.6437 | 0.42 |
| | 81.9 | 32763.939471 | 32764.258974 | 9.75 | 32763.99239 | 1.62 |
| | 87.0 | 32763.134068 | 32763.543647 | 12.50 | 32763.25456 | 3.68 |

Figure 16B

| °C | ADC | Measured Frequency | Curve Fit On °C | PPM Error | Curve Fit On ADC | PPM Error |
|---|---|---|---|---|---|---|
| -40.6 | 9151 | 32763.427836 | 32763.34469 | -2.54 | 32763.37785 | -1.53 |
| -35.4 | 9361 | 32764.166349 | 32764.08903 | -2.36 | 32764.13566 | -0.94 |
| -30.1 | 9569 | 32764.808542 | 32764.78229 | -0.80 | 32764.82059 | 0.37 |
| -24.8 | 9762 | 32765.402176 | 32765.40952 | 0.22 | 32765.39768 | -0.14 |
| -19.5 | 9964 | 32765.919598 | 32765.97072 | 1.56 | 32765.94143 | 0.67 |
| -14.5 | 10160 | 32766.377080 | 32766.43964 | 1.91 | 32766.41012 | 1.01 |
| -9.4 | 10363 | 32766.797818 | 32766.85739 | 1.82 | 32766.83438 | 1.12 |
| -4.1 | 10554 | 32767.164887 | 32767.22675 | 1.89 | 32767.17673 | 0.36 |
| 1.0 | 10761 | 32767.463221 | 32767.51984 | 1.73 | 32767.48554 | 0.68 |
| 6.0 | 10960 | 32767.705132 | 32767.74783 | 1.30 | 32767.72141 | 0.50 |
| 11.0 | 11163 | 32767.884747 | 32767.91706 | 0.99 | 32767.90039 | 0.48 |
| 16.2 | 11360 | 32768.009601 | 32768.03072 | 0.64 | 32768.01457 | 0.15 |
| 21.1 | 11548 | 32768.069817 | 32768.07966 | 0.30 | 32768.06887 | -0.03 |
| 26.0 | 11744 | 32768.078214 | 32768.07217 | -0.18 | 32768.06865 | -0.29 |
| 30.7 | 11915 | 32768.027082 | 32768.01196 | -0.46 | 32768.02107 | -0.18 |
| 36.0 | 12141 | 32767.915016 | 32767.88177 | -1.01 | 32767.89042 | -0.75 |
| 41.2 | 12336 | 32767.737652 | 32767.68987 | -1.46 | 32767.7157 | -0.67 |
| 46.1 | 12530 | 32767.505928 | 32767.45088 | -1.68 | 32767.48488 | -0.64 |
| 51.4 | 12735 | 32767.193776 | 32767.12884 | -1.98 | 32767.17921 | -0.44 |
| 56.4 | 12944 | 32766.824921 | 32766.76451 | -1.84 | 32766.80223 | -0.69 |
| 61.7 | 13152 | 32766.374418 | 32766.31417 | -1.84 | 32766.36155 | -0.39 |
| 66.6 | 13355 | 32765.874984 | 32765.83907 | -1.10 | 32765.86846 | -0.20 |
| 71.8 | 13567 | 32765.300005 | 32765.27317 | -0.82 | 32765.28707 | -0.39 |
| 77.0 | 13778 | 32764.629838 | 32764.6437 | 0.42 | 32764.64102 | 0.34 |
| 81.9 | 13982 | 32763.939471 | 32763.99239 | 1.62 | 32763.95247 | 0.40 |
| 87.0 | 14193 | 32763.134068 | 32763.25456 | 3.68 | 32763.17417 | 1.22 |

Figure 18B (Age Compensation)

| 2011 | 2012 | 2013 | |
|---|---|---|---|
| 11111111 | 11111111 | 11111111 | Count = 0 |

Figure 21A

| | | | |
|---|---|---|---|
| 11111111 | 11111111 | 11111110 | Count = 1 |

Figure 21B

| | | | |
|---|---|---|---|
| 11111111 | 11111111 | 11111100 | Count = 2 |
| 11111111 | 11111111 | 11111000 | Count = 3 |
| 11111111 | 11111111 | 11110000 | Count = 4 |
| 11111111 | 11111111 | 11100000 | Count = 5 |
| 11111111 | 11111111 | 11000000 | Count = 6 |
| 11111111 | 11111111 | 10000000 | Count = 7 |

Figure 21C

| | | | |
|---|---|---|---|
| 11111111 | 11111110 | 11111111 | Count = 8 |

Figure 21D

| | | | |
|---|---|---|---|
| 11111111 | 11111110 | 11111110 | Count = 9 |
| 11111111 | 11111110 | 11111100 | Count = 10 |
| 11111111 | 11111110 | 11111000 | Count = 11 |
| 11111111 | 11111110 | 11110000 | Count = 12 |

Figure 21E

| | | | |
|---|---|---|---|
| 11111111 | 10000000 | 10000000 | Count = 64 |
| 11111110 | 11111111 | 11111111 | Count = 65 |

Figure 21F

SYSTEMS AND METHODS FOR COMPENSATING FOR VARIATIONS OF THE OUTPUT OF A REAL-TIME CLOCK

RELATED APPLICATIONS

The present application claims benefit of provisional application Ser. No. 61/015,590, filed Dec. 20, 2007, the entire disclosure of which is expressly incorporated by reference herein.

FIELD OF THE INVENTION

The present invention generally relates to clocks for electronic devices and, more particularly, to real-time clocks.

BACKGROUND

A real-time clock or "RTC" is a unit or module such as an Integrated Circuit (IC) that tracks time continuously whether the host system is powered or not. RTCs are typically powered by a dedicated back-up battery or other power source to provide a real-time clock value that indicates, e.g., day, date, and time. RTCs are used, for example, in personal computers, personal digital assistants (PDAs), cellular telephones, and other devices that track time.

Referring to FIG. 1A, one known RTC component, such as a RTC chip or IC 10, includes an oscillator 11, a counter 12, a processor 13, a temperature sensor 14 and a memory 15. A battery 16 provides power to the chip 10 components. One known oscillator 11 includes a crystal, e.g., a quartz crystal, an inverting amplifier, capacitors, resistors, and a Schmitt trigger. The output of the oscillator 11 is provided to the counter 12, the contents of which are incremented by the output of the oscillator 11 to count the number of pulses generated by the oscillator 11. The processor 13 is coupled to the counter 12 and provides an adjustment signal 16 to the counter 12.

More particularly, the processor 13 obtains temperature data from a temperature sensor, thermocouple, or thermistor 14 and refers to memory 15, which stores a temperature compensation formula or lookup table 20, e.g., a generic formula or table that applies to multiple oscillators 11, that is used to calculate an estimated counting error based on the actual temperature. If an error exists, the processor 13 sends the counter 12 an adjustment signal 16 (based on the generic or custom formula 20) to compensate for temperature effects on the output of the oscillator 11. For certain RTC chips 10, there may be at least three sources of timing errors: offset error, temperature error, and aging error.

Offset error is the difference between the expected frequency of the output of the RTC chip 10 and the actual frequency of the output of the RTC chip 10. RTCs often include a quartz oscillator 11 having a nominal or nameplate frequency. One known nameplate frequency is 32.768 kHz or 32,768 Hz (cycles or pulses or counts per second). Thus, a "32,768 Hz oscillator" is designed and expected to output a signal of a frequency of 32,768 Hz. The oscillator 11, however, may not be properly adjusted or designed resulting in oscillator variations and inaccuracies. Consequently, the actual or measured frequency of the oscillator 11 may differ from the expected 32,768 Hz frequency.

For example, if the nominal frequency of an oscillator 11 is 32,768 Hz, the actual frequency may be, e.g., 32,771.990629 Hertz. The period of each pulse of the oscillator 11 output is expressed as the inverse of the frequency or, in this example, 1/32771.990629=30.5138620146894 micro-seconds. This offset results in inaccurate timekeeping and a timing error of about 320 seconds per month, calculated as follows:

Error (ppm)=1,000,000*(measured frequency−nominal frequency)/(nominal frequency), wherein "ppm" is "parts per million,"

Seconds per month=(60 seconds per minute)*(60 minutes per hour)*(24 hours per day)*(365 days per year)/(12 months per year)=2,628,000 seconds per month, 1 ppm in seconds per month=(seconds per month)/1,000,000=2.628 seconds, and Seconds per month error=(error in ppm)*(2.628 seconds per ppm)=121.784*2.628=320.049 seconds per month.

An error of 320 seconds per month due to frequency offset can be particularly problematic when multiplied over a number of months and years.

Certain oscillators include adjustment mechanisms to compensate for temperature variations. For example, as shown in FIG. 1, each RTC chip 10 supplied by a manufacturer may be programmed with the same generic temperature compensation formula 20 at the time of manufacture or programming. Thus, the same formula 20 may apply to all of the oscillators 11 on all of the chips 10 supplied by a manufacturer. An example of a generic temperature compensation formula 20 that is used to calculate the error resulting from temperature variations of a 32,768 Hz crystal oscillator is Error=$\Delta F/F=K^*(T-T_0)^2$ where "T" is the measured or actual temperature, "F" is the frequency. "$\Delta F$" is the change in frequency, "K"=$-0.036$ ppm/° $C.^2 \pm 0.006$ ppm/° $C.^2$ and $T_0=25°\ C.\pm5°\ C.$ Referring to FIG. 1B, it is also known to perform calibration tests to determine how the output of an oscillator 11 varies with temperature, e.g., to determine a formula that applies to one, some, or all of the oscillators 11. For this purpose, one known calibration system 20 includes an environmental chamber 22, a frequency counter or detector 24, an off-chip, i.e., external, temperature measurement element 26, and a frequency source 28. During calibration, the frequency source 28 is coupled to the chip(s) 10 in the environmental chamber 20. The temperature inside the chamber 22 is cycled through a series of different temperatures, and the frequency of the output of the oscillator 11 is determined at each temperature, as determined by the frequency counter 24 and the off-chip or external temperature measurement element 26. The temperature variations can then be compiled as a look-up table or reflected as a temperature compensation formula.

While such calibration systems 20 may have been used with some effectiveness in the past, temperature measurements using an off-chip or external temperature measurement element 26 introduce undesirable temperature measurement errors that lead to counting and timing inaccuracies. Further, all oscillators 11 are not the same and require different adjustments. Thus, a generic temperature compensation formula 20 may be acceptable to compensate some oscillators 11, but not all oscillators 11. As a result, a programmed generic formula 20 is not suitable for all oscillators 11, and may also introduce undesirable counting and timing errors into those oscillators 11 that require different or more robust compensation.

Frequency variations may also result from "aging" or internal changes in the oscillator 11 over time. For example, the crystal material of the oscillator 11 may change or the crystal material or structure may change. One or more of these "aging" factors may result in the oscillator 11 frequency changing over time, thereby resulting in deviations from the expected frequency over time. Aging errors may be computed if an appropriate formula is developed or supplied by the manufacturer of the RTC chip 10.

Even if frequency offset and frequency variations caused by temperature and aging can be compensated to some degree, to count exactly one second of time, exactly 32,771.990629 oscillations (in the above example) must be counted to count one second. Known RTC chips 10, however, may not be able to count a fraction of a single oscillation, thereby resulting in some amount of error. Further, certain systems may attempt to compensate for one cause of frequency variations, e.g., temperature, but may not be capable of addressing multiple sources of frequency variations.

Accordingly, it would be desirable to be able to compensate for offset, temperature and/or aging in a more accurate and reliable manner. Further, it may be desirable to achieve these improvements as part of an integrated solution that does not require an off-chip or external temperature measurement element. Additionally, it may be desirable to program RTC chips with customized temperature compensation profiles to achieve higher degrees of accuracy.

SUMMARY

The present invention is directed to clocks for electronic devices and, more particularly, to real-time clocks.

In accordance with one embodiment, a method is provided for correcting offset of a real-time clock that includes determining a frequency of an output of an oscillator, the frequency being represented as an integer (i) portion and a non-integer (ni) portion; and counting a first number (a) of "i" oscillations and counting a second number (b) of "i+x" oscillations by dithering between "i" and "i+x" oscillations, wherein an average of the first number (a) of "i" oscillations and the second number (b) of "i+x" oscillations is an effective number of oscillations that is approximately the same as the determined frequency.

In accordance with another embodiment, a method is provided for correcting offset of an oscillator of a real-time clock that includes determining a frequency of an output of an oscillator, the frequency being represented as an integer (i) portion and a non-integer (ni) portion; and counting a first number (a) of "i" oscillations and counting a second number (b) of "i+1" oscillations by dithering between "i" oscillations and "i+1" oscillations, wherein an average of the first number (a) of "i" oscillations and the second number (b) of "i+x" oscillations is an effective number of oscillations that is the same as or approximately the same as the determined frequency.

In accordance with still another embodiment, a method is provided for correcting offset of an oscillator of a real-time clock that includes determining a frequency of an output of an oscillator, the frequency being represented as an integer (i) portion and a non-integer (ni) portion; and counting a first number (a) of "i" oscillations and counting a second number (b) of "i+1" oscillations by dithering between "i" oscillations and "i+x" oscillations, wherein a ratio of (first number (a)*i)+ (second number (b)*(i+x)/(first number (a)+second number (b)) is an effective number of oscillations that is the same as or approximately the same as the determined frequency.

In accordance with yet another embodiment, a real-time clock is provided that includes a frequency source, a counter coupled to the frequency source and being configured to generate a count value based on an output of the frequency source; and a controller coupled to the counter and being configured to adjust the counter to reflect the actual output of the frequency source by reading the count value from the counter based on the actual output of the frequency source to determine an actual frequency of the output of the frequency source, the frequency being represented as an integer (i) portion and a non-integer (ni) portion, counting a first number (a) of "i" oscillations and counting a second number (b) of "i+1" oscillations by dithering between "i" oscillations and "i+1" oscillations, wherein a ratio of (a*i)+(b*(i+1)/(a+b) is the same as or approximately the same as the determined frequency.

In accordance with still another embodiment, a system is provided for compensating for age-induced frequency variations of an oscillator that includes a counter; a controller coupled to the counter; and a non-volatile memory coupled to the controller, wherein an age of the oscillator is tracked using the non-volatile memory, and the output of the non-volatile memory is provided to the controller, the controller adjusting the counter based on the output of the controller.

In accordance with yet another embodiment, a system is provided for correcting frequency variations of an oscillator that includes a counter; a controller coupled to the counter; an analog-to-digital converter coupled to the controller; a temperature sensor coupled to the analog-to-digital converter, wherein analog data from the temperature sensor is provided to the analog-to-digital converter, the analog-to-digital converter transforms the analog data into digital data, the digital data being provided to the controller, the controller being configured to adjust the counter based on the digital output of the analog-to-digital converter without knowing the temperature; and a flash memory coupled to the controller, wherein an age of the oscillator is tracked using the flash memory, an output of the flash memory is provided to the controller, and the controller is configured to adjust the counter to compensate for the age of the oscillator based on the output of the controller related to the flash memory.

In accordance with still another embodiment, a method for calibrating a plurality of real time clocks that includes receiving a plurality of real time clocks; calibrating each real time clock using an off-chip frequency counter, an on-chip temperature measurement element and an on-chip analog-to-digital converter; and programming each real time clock with customized calibration data.

In accordance with yet another embodiment, a method is provided for calibrating a real time clock that includes receiving a real time clock having an on-chip temperature measurement element; inserting the real time clock into an environmental chamber; exposing the real time clock inside the environmental chamber to a plurality of temperatures; measuring each temperature of the plurality of temperatures using the on-chip temperature sensor; detecting the frequency of the output of each real time clock at each measured temperature; and determining a curve fit function based on the measured temperatures and frequencies; programming the real time clock with the determined curve fit function.

In accordance with still another embodiment, a method is provided for calibrating and adjusting a real time clock that includes calibrating the real time clock and correcting offset of the oscillator of the real-time clock. The real time clock may be calibrated, for example, by inserting the real time clock into an environmental chamber; exposing an oscillator of the real time clock inside the environmental chamber to a plurality of temperatures; measuring each temperature of the plurality of temperatures using an on-chip temperature sensor of the real time clock; detecting the frequency of the output of the oscillator at each measured temperature; determining a curve fit function based on the measured temperatures and frequencies; and programming the real time clock with the determined curve fit function. The offset of the oscillator of the real-time clock may be corrected, for example, by determining a frequency of an output of the oscillator, the frequency being represented as an integer (i) portion and a non-integer (ni) portion; counting a first number (a) of "i" oscillations and counting a second number (b) of "i+x" oscillations by dithering between "i" and "i+x" oscillations, wherein an average of the first number (a) of "i" oscillations and the second number (b) of "i+x" oscillations is an effective number of oscillations that is approximately the same as the determined frequency; and compensating for age-induced frequency variations of the oscillator using flash memory.

Aspects and features of the present invention will become apparent from consideration of the following description taken in conjunction with the accompanying drawings.

BRIEF DESCRIPTION OF THE DRAWINGS

The drawings illustrate exemplary embodiments of the invention, in which:

FIG. 3 illustrates integer and non-integer components of a frequency.

FIG. 4 is a flow chart showing an exemplary embodiment of a method for compensating for frequency offset of a frequency source.

FIG. 8 illustrates an exemplary embodiment of a method for compensating for oscillator offset by alternating counts.

FIG. 9 illustrates an exemplary embodiment of a method for compensating for oscillator offset by interleaving or dithering counts.

FIG. 10 illustrates one method of implementing dithering as shown in FIG. 9.

FIG. 13 illustrates exemplary values generated by a dithering method.

FIG. 16B is a table comparing calibration data acquired using an on-chip temperature measurement element, such as that shown in FIG. 16A, to data acquired using a known calibration system including an off-chip temperature sensor, such as that shown in FIG. 1B, and modeled using a known generic compensation formula.

FIG. 18B illustrates calibration data acquired using the system configuration shown in FIG. 18A.

FIGS. 21A-F illustrate an exemplary embodiment of a method for tracking an age of a device using non-volatile memory.

DETAILED DESCRIPTION OF ILLUSTRATED EMBODIMENTS

Systems and methods are provided that may improve upon shortcomings of known RTCs. Systems and methods maintain accurate timing by correcting or compensating for offset and/or frequency variations, such as those caused by temperature and/or age. Embodiments advantageously utilize on-chip or internal temperature sensors during calibration rather than an off-chip or external temperature sensor as in known systems. Improvements may be realized while consuming less power. Some embodiments disclosed herein may achieve one or more of these advantages without having to know actual temperature values or temperature look-up tables.

Offset Compensation

Figure 2:
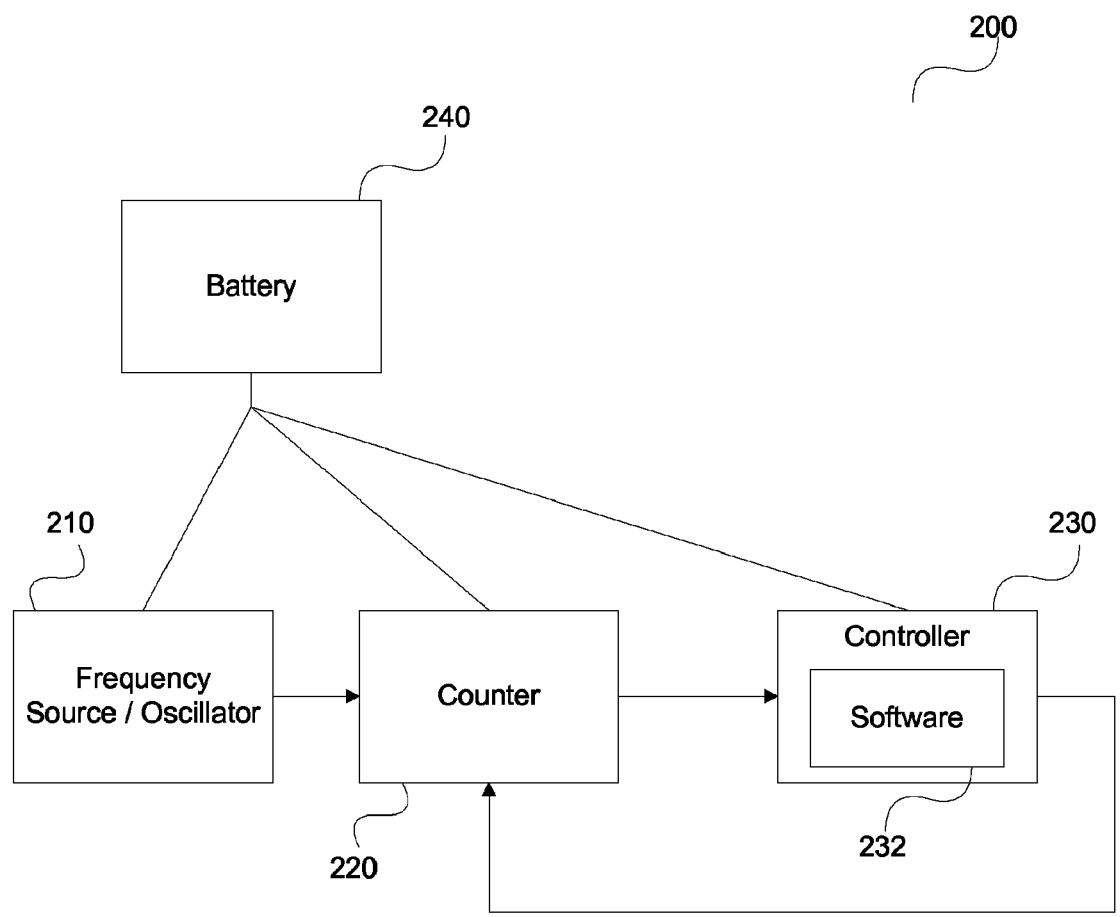
FIG. 2 illustrates an exemplary embodiment of a RTC system for compensating for frequency offset of a frequency source.

Referring to FIG. 2, according to one embodiment, an RTC or RTC system (generally "RTC") 200 may be part of a chip, integrated circuit (IC) or module (generally referred to as a "chip") and is shown for compensating for or correcting frequency offset of a frequency source 210. The RTC generally includes a counter 220, a controller or processor 230 (generally processor 230) and a power source 240, such as system power or a battery, for providing power to the RTC components. The counter 220 is shown as a separate component but may, for example, be part of an integrated circuit.

According to one embodiment, method steps of embodiments may be implemented by software 232 residing in the controller 230 (as shown in FIG. 2) or another component or memory. Alternatively, embodiments may be implemented using hardware and a combination of software and hardware. Thus, FIG. 2 is provided for purposes of explanation and illustration, and it should be understood that embodiments may be implemented using hardware, software, or a combination thereof, as desired.

According to one embodiment, the frequency source 210 is an oscillator, such as a crystal oscillator. One example of a crystal oscillator is a quartz oscillator. Embodiments may be implemented using various frequency sources 210 and various oscillators, which generate outputs having various frequencies. For purposes of explanation, this specification refers to a crystal oscillator 210 that generates an output having a nominal frequency of 32,768 Hz, but embodiments may be implemented or applied to other frequency sources 210 depending on, for example, the particular application or device that uses the RTC 200.

Referring to FIG. 3, and continuing with the example in which the measured or actual frequency of an output of an oscillator 210 is determined to be 32,771.990629 Hz (rather than the nominal frequency of 32,768 Hz), exactly 32,771.990629 cycles must be counted to count one second of time as a result of the offset. The measured or actual number of oscillations that is required is a number 300 that may be expressed or represented as an integer portion (i) or whole number 310 and a non-integer portion (ni) 320, such as a decimal or fraction. In the illustrated example, the integer portion (i) 310 is 32,771, and the non-integer (ni) portion 320 is 0.990629. Thus, the integer portion (n) 120 may be the truncated value of the frequency.

Referring to FIG. 4, according to one embodiment, a method 400 for controlling a RTC to compensate for frequency offset of an oscillator may include initially determining, in step 405, the actual output of the oscillator, i.e., a number of cycles of an output of the oscillator required to count an amount of time (e.g., one second). The actual output may be measured directly or, alternatively, determined indirectly using an error analysis. One example of an error analysis is based on a starting frequency value and the frequency error relative to the starting frequency value over time. In step 410, a first number (a) of "i" oscillations is counted, and in step 415, a second number (b) of "i+x" oscillations is counted.

In one embodiment, steps 410 and 415 are performed in such a manner so that an average of the first number (a) of "i" oscillations and the second number (b) of "i+x" oscillations is an effective number of oscillator cycles (eoc) that is the same as or approximately the same as the actual, determined, or measured frequency, i.e., the number of cycles needed to count one second of time based on the actual output of the oscillator. In one embodiment, this is expressed as a ratio. For example, assume the measured or actual output of an oscillator 210 is 32,768.750 Hz rather than the nominal or nameplate frequency of 32,768 Hz. Thus, the desired number of oscillations needed to count one second is 32,768.750 oscillations, which may be approximated by counting a certain number (a) of "i=32,768" oscillations and a certain number (b) of (i+1)=32,769 oscillations so that the effective number of oscillator cycles (eoc) over time is 32,768.750. In this example, one set or group of (i=32,768) cycles is counted, and three sets or groups of "i+1=32,769" cycles is counted: 32,768; 32,769; 32,769; 32,769 so that the average or effective number of oscillator cycles (eoc) with these four values is 32,768.750 which, in this example, is the same as the actual frequency, thereby allowing accurate timekeeping. This may also be expressed as follows:

Effective oscillator cycles (eoc)=32,768.750=(1*32,768+3*32,769)/(1+3), which may be generalized as a ratio:

Effective oscillator cycles (eoc)=$(a*i+b*(i+1))/(a+b)$, where:
i=value of integer portion (e.g., truncated value of actual frequency),
(i+1)=next higher integer,
a=first number; number of times "i" is counted, and
b=second number; number of times (i+1) is counted, respectively, which may be simplified as:

Effective oscillator cycles (eoc)=$i+b/(a+b)$.

In the illustrated embodiment, "i"=the truncated frequency value and "x"=1 so that the number of oscillations counted differs by one oscillation. In other embodiments, the value "i" may or may not be the truncated frequency value. In an alternative embodiment, "i" is less than the truncated value. In other embodiments, different numbers can be added to "i" so that rather than a first number (a) of "i" and a second number (b) of "i+1," embodiments may utilize a first number (a) of "i" and a second number (b) of "i+2" or second number (b) of "i+3" and so on, or combinations thereof with appropriate modifications to the methods and calculations described above. One manner in which this may be done is by assigning different weights to different oscillation counts or by counting different numbers of cycles.

Figure 5:
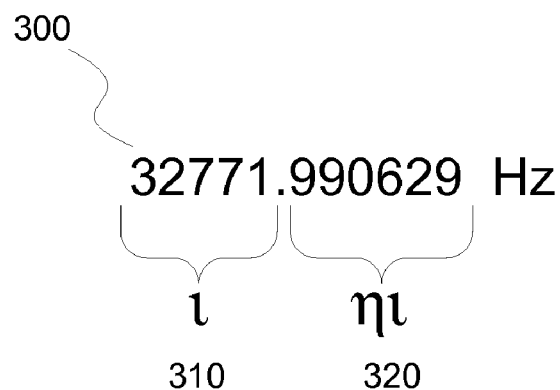
FIG. 5 generally illustrates an exemplary embodiment of a method for counting a first number (a) of integer (i) counts and a second number (b) of non-integer (ni) counts.

FIG. 5 illustrates another example involving an oscillator 210 output of 32,771.990629 Hz. The counter 220 is configured to count a first number (a) of "i" or 32771 oscillations and a second number (b) of "i+x", e.g., "i+1" or 32,772 oscillations are counted so that the number of oscillations over time is equal to, approximately equal to, or effectively 32,771.990629. A counter 220 may be configured to count a certain number (a) of "i" or 32,771 oscillations and a certain number (b) of "i+2" or 32,773 oscillations so that the effective number of oscillations over time is equal to, approximately equal to, 32,771.990629. Similarly, a counter 220 may be configured to count a certain number (a) of "i" or 32,771 oscillations and a certain number (b) of "i+5" or 32,776 oscillations. Further, although embodiments are discussed with reference to "i" being the truncated value, "i" may be less than the truncated value, e.g., 32,770, 32,769, and so on, and "i+x" or "i+(other values)" may be appropriately adjusted. Accordingly, FIGS. 4 and 5 are provided as examples of how embodiments may be implemented, and embodiments may be applied to various frequencies other than the example frequencies discussed in this specification.

Figure 6:
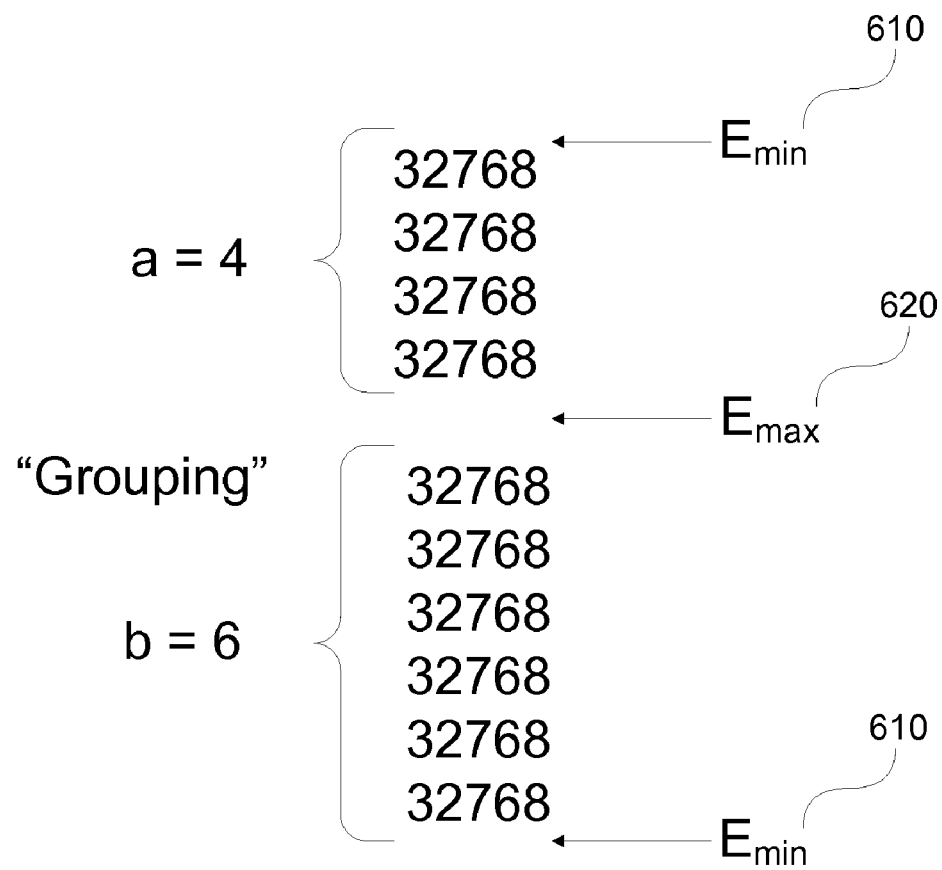
FIG. 6 illustrates an exemplary embodiment of a method for compensating for oscillator offset by counting groups of oscillations.

Referring to FIG. 6, according to another embodiment directed to compensating for oscillator 210 offset, the desired frequency may be approximated by counting the first number of "i" oscillations first, followed by counting the second number of "i+1" oscillations. FIG. 6 illustrates an example in which the number of counts required to count one second of time is 32,768.6 counts. In this example, four (a) counts of 32,768 oscillations are performed, followed by six (b) counts of 32,769 oscillations so that the effective number of oscillation counts (eoc) is 32,768.6. Alternatively, the effective number of oscillations may be achieved by counting in the reverse order, i.e., counting the second number (b) of "i+1" or 32,769 oscillations first, followed by the first number (a) of "i" or 32,768 oscillations second. As a further example, assuming the actual frequency is 32,771.990629 Hz (as shown in FIG. 5), then 32,771 cycles may be counted (a) times, e.g., 9,371 times, and then 32,772 cycles may be counted (b) times, e.g., 990,629 times, to provide an effective number of oscillation counts (eoc) of 32,771.990629 oscillations.

Additionally, embodiments may be implemented using appropriate ratios. For example, referring to FIG. 6, rather than counting "32,768" oscillations four times and then counting "32,769" oscillations six times, embodiments may be implemented by counting "32,768" oscillations two times, then counting "32,769" oscillations three times. As a further alternative, embodiments may be implemented by counting "32,768" oscillations six times, and "32,769" oscillations nine times. Other ratios may also be utilized as appropriate.

Figure 7:
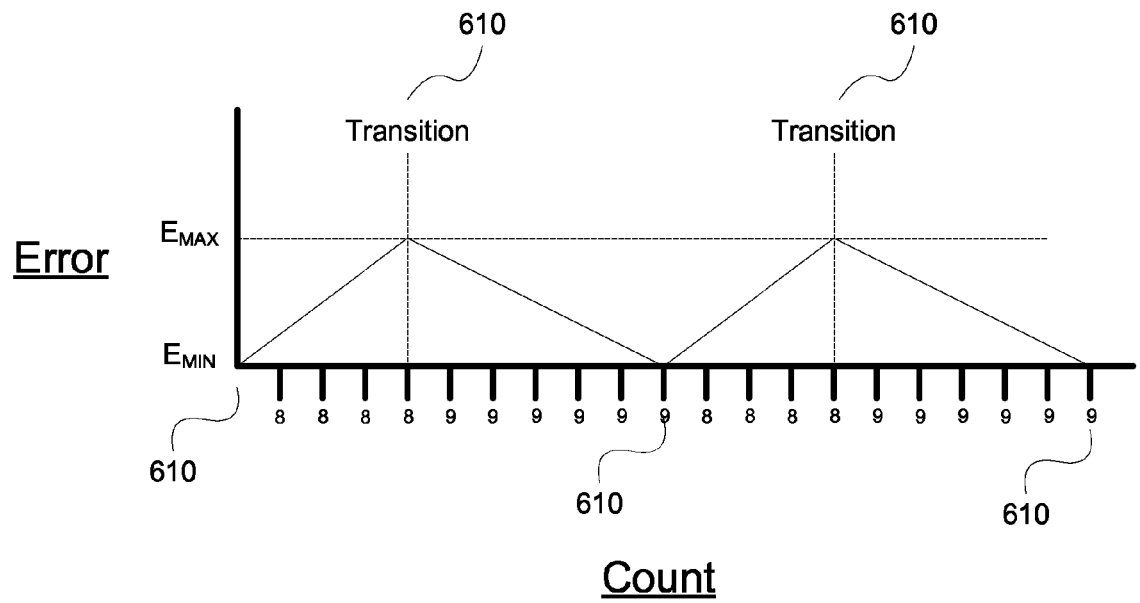
FIG. 7 illustrates error resulting from counting groups of oscillations.

While embodiments provide the desired or effective number of oscillator 210 counts over time, there may be some instantaneous error that develops during counting of the first integer or the second integer. For example, referring to FIGS. 6 and 7, there may be a reduced or minimum error ($E_{Min}$) 610 at the beginning of counting, and as a group of "32,768" oscillations is counted four times, the error accumulates, until it is a maximum error ($E_{Max}$) 620 at the transition point of counting 32,768 oscillations to counting 32,769 oscillations. Upon counting 32769 oscillations, the error decreases until it reaches a zero or minimum value 610 at the last count of 32,769 oscillations.

As a further example, in the example involving an oscillator 210 having an output of 32,771.990629 Hz, the largest instantaneous error occurs at the point were 32,771 has been counted 9371 (a) times. More specifically, the instantaneous error is at a maximum at the transition from "a" counting to "b" counting. In the example involving 32,771.990629 Hz, 1,000,000 counts is 1,000,000 seconds, which means that timekeeping is exact only once every 1,000,000 seconds, which is roughly once every 11.5 days. The error of 0.283265806587877 seconds is computed as:

Number of cycles in one second=32,771.990629,

Period of frequency source=1/32,771.990629,

Expected number of cycles=32,
771.990629*9371=307106324.184359 cycles,

Actual number of cycles=32,771*9371=307097041,

Difference between expected cycles and actual cycles=307106324.184359−307097041=9283.18435901403 cycles, Maximum instantaneous error in seconds=9283.18435901403 cycles*period of frequency source=9283.18435901403/
32771.990629=0.283265806587877 seconds.

This may be restated as:

Maximum instantaneous error in seconds=$a*(f-i)/f$, where:
  a=the a count or the number of times "i" oscillations is counted,
  f=measured or predicted frequency, and
  i=the integer resulting from truncating the measured or predicted frequency.

Note that (f−i) is equivalent to b/(a+b), so the above may be re-stated as:

Maximum instantaneous error in seconds=$(a*b)/(a+b)/f$.

As a further example, if the measured or predicted frequency of the oscillator 210 is 32766.499999, then the resulting error would be:

Error=500001*499999/1000000/
32766.499999=7.6297 seconds.

However, every 1,000,000 seconds, the real-time cumulative error returns to zero.

Referring to FIG. 8, in another embodiment of a method for compensating for oscillator 210 offset, instantaneous errors that might occur (e.g., as discussed above with reference to FIGS. 6 and 7), may be compensated by counting oscillations in an alternating manner. In the illustrated example involving 32,768.6 Hz, a first count of 32,768 oscillations may be performed, followed by a first count of 32,769 oscillations, followed by a second count of 32,768 oscillations, followed by a second count of 32,769 oscillations, and so on as appropriate. Alternating counting of different numbers of oscillations continues so long as alternating counts are possible. In the illustrated embodiment involving four counts of 32,768 oscillations and six counts of 32,769 oscillations, the last three counts are all counts of 32,769 oscillations since no additional groups of 32,768 oscillations are available for alternating counting until, e.g., a new set of oscillations is to be counted. With this embodiment, the effective number of oscillations is 32,768.6 while reducing the instantaneous error that may result from the embodiment shown in FIG. 6.

Referring to FIG. 9, in a further embodiment of a method for compensating for oscillator 210 offset, instantaneous errors that might occur (e.g., as discussed above with reference to FIGS. 6 and 7), may be compensated by counting based on dithering or interleaving oscillations counts. In this method, continuing with the previous example, counting of 32,768 oscillations and counting of 32,769 oscillations are performed so that at any time, the real time cumulative error is limited to only one oscillator period, which is roughly 30.5 micro-seconds in the case of a 32,768 Hertz frequency source, which is (1/(the measured or predicted frequency)). Dithering between i and (i+1) integer cycle counts in the ratio b/(a+b) while interleaving the a counts and the b counts advantageously allows approximation of the desired frequency without accumulating a real time instantaneous error of more than one cycle. The method may be performed very well using computer arithmetic that has sufficient precision.

Figure 11:
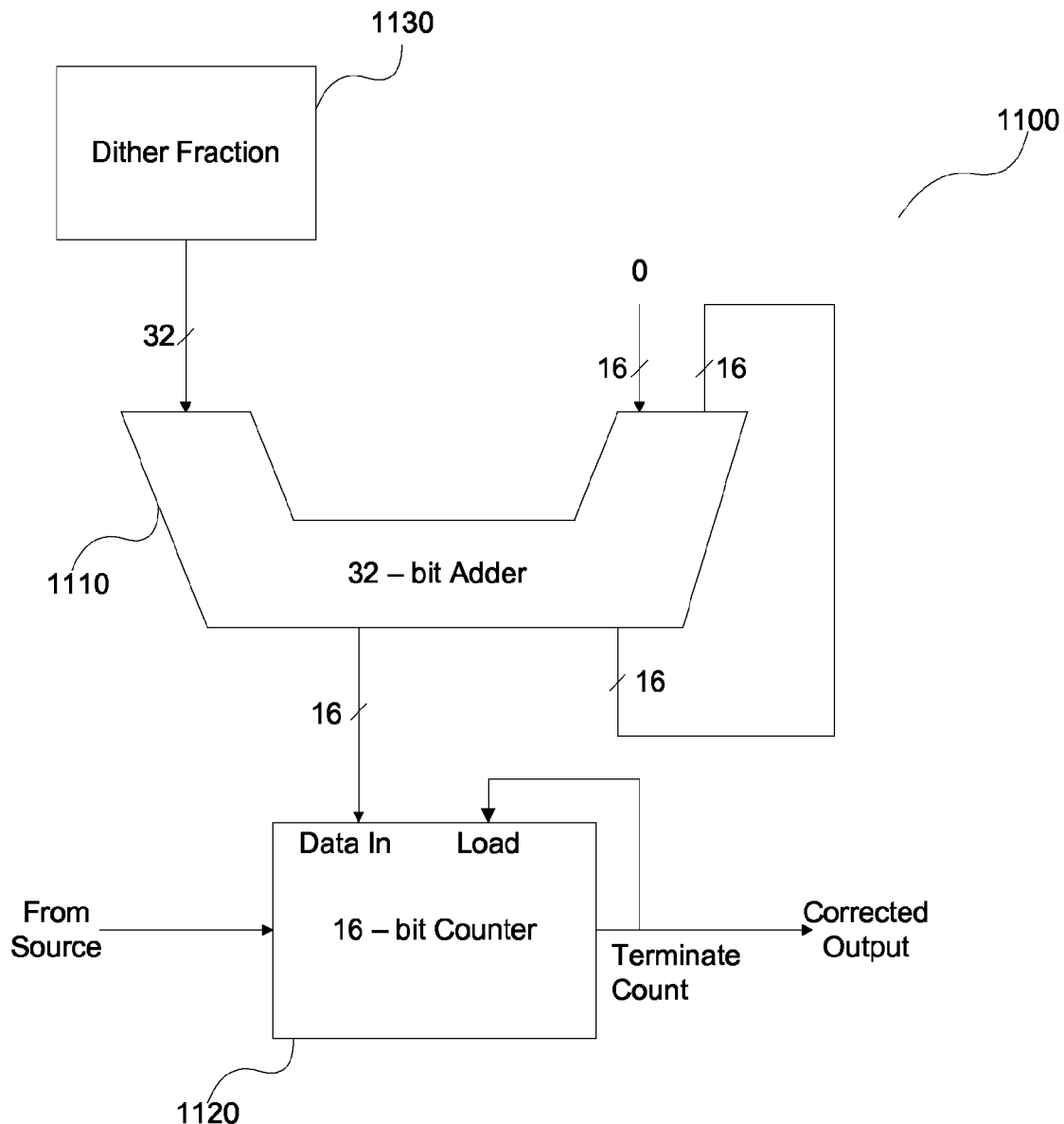
FIG. 11 illustrates an exemplary embodiment of a circuit for implementing the dithering method shown in FIGS. 9 and 10.

FIG. 10 is a chart that illustrates one manner in which the sequence of counts may be determined using an example involving scaled integer arithmetic. FIG. 11 illustrates a circuit 1100 according to one embodiment that includes an accumulator 1110 (e.g., a 32 bit accumulator) and a counter 1120 (e.g., a 16-bit counter) that may be used to implement the method shown in FIG. 10. The chart illustrated in FIG. 10 shows an integer portion 1010 and a fraction portion 1020. A fractional value 1022 is added to the previous fractional portion 1020, and a determination is made whether the fractional portion 1020 rolls over (i.e., rolls over to a value greater than or equal to zero). If so, then a count of 32,769 oscillations is performed. If not, then a count of 32,768 oscillations is performed. Additional roll over determinations are made after the fractional portion is added again.

More specifically, in the illustrated embodiment, a first count of 32,768 oscillations 1010a is initially counted, and the corresponding fractional portion 1020a is zero. After the first count 1010a, a faction value 1022 (0.6, in this example) is added to the first faction value 1020a (0). In this example, the fraction value 1022 is 0.6 (calculated based on six counts of 32,769 oscillations of a group of 10 oscillation counts). Of course, the fraction value 1022 may be utilized, and the value of 0.6 is provided for a simplified example. The fraction value 1022 (0.6) is added to the first fraction value 1020a (0), resulting in a second fractional value 2020 (0.6). Thus, there is no roll over after this iteration, and the second count 1010b is a second count of 32,768 oscillations. After the second count 1010b, the fraction value 1022 (0.6) is added to the second fraction value 1020b (0.6), resulting in a third fraction value 1020c of 1.2. Thus, the third fraction value 1020c rolls over, and the resulting third fractional value 1020c is 0.2. As a result, the third count 1010c is a first count of 32,769 oscillations. A fraction value (0.6) is added to the third fractional value 1020c (0.2), resulting in a fourth fractional value 1020d (0.8). Thus, there is no roll over, and the fourth count 1010d is a third count of 32,768 oscillations. A fractional value (0.6) is added to the fourth fractional value 1020d (0.8) resulting in a fifth fractional value 1020e in the sum of 1.4. Thus, the third fractional value 1020e rolls over, and the resulting fifth fractional value 1020e is 0.4. As a result, the fifth count 1010e is a second count of 32,769 oscillations. The method continues in order to interleave different counts as generally illustrated in FIG. 10. Embodiments may be implemented in various other manners, including using binary scaled integer arithmetic and other suitable methods.

Figure 12:
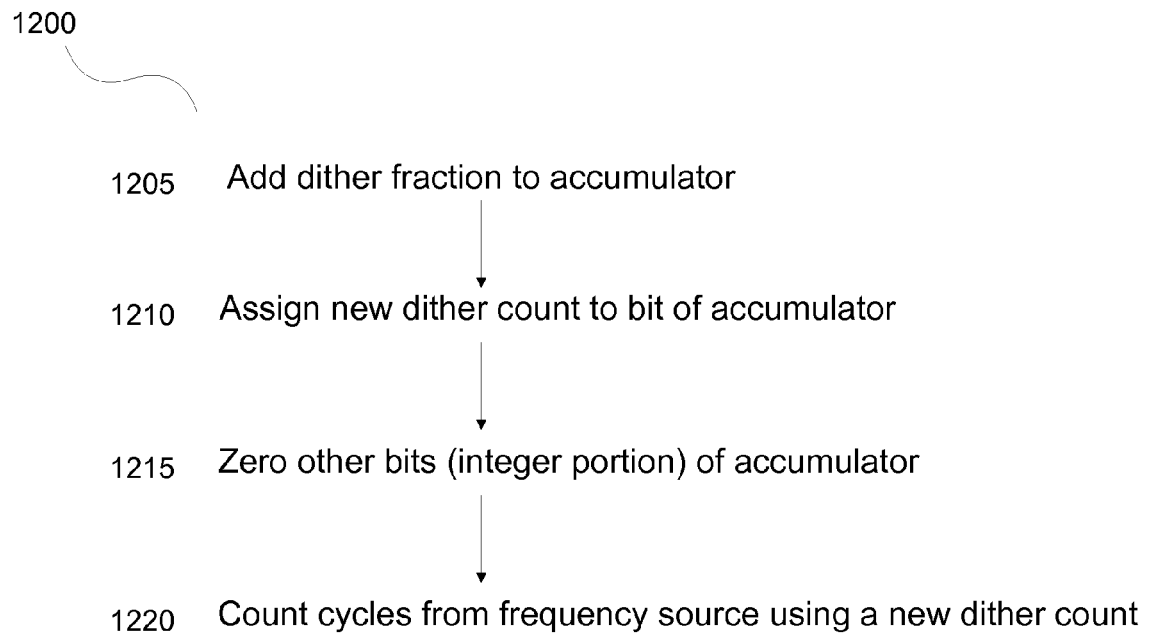
FIG. 12 is a flow chart illustrating an exemplary embodiment of a method for compensating for oscillator offset by dithering.

Referring to FIGS. 11 and 12, a method 1200 for interleaving or dithering counts for compensating for oscillator 210 offset (as shown in FIGS. 9 and 10) may be implemented using an accumulator 1110 and a counter 1120 (as shown in FIG. 11). The method 1200 includes adding the dither fraction 1130 to an accumulator 1110 in step 1205. In one embodiment, the accumulator 1110 is a 32-bit accumulator, and a first or upper 16 bits is the integer portion of the accumulator 1110, and a second or lower 16 bits is the fractional portion of the accumulator 1110. The 32-bit number is referred to as a dither fraction 1130. Other accumulator 1110 configurations may be used, as desired. In step 1210, the new dither count becomes the upper 16 bits of the 32 bit accumulator 1110. Thus, the integer portion of the accumulator 1110 is changed. In step 1215, the upper 16 bits of the accumulator 1110 are zeroed so that the integer portion of the accumulator 1110 includes all zero values. In step 1220, the new dither count is used to count cycles from the frequency source. As the dither fraction 1130 is added to the accumulator 1110, a carry out into the integer portion of the accumulator generates an (i+1) dither count. A no-carry is responsible for generating an "i" dither count. In this manner, the "a" number of "i" counts and "b" number of "i+1" counts are automatically interleaved, thereby minimizing instantaneous frequency error in real-time. Steps 1205-1215 may be repeated as necessary.

FIG. 13 illustrates a more detailed example of dithering using an oscillator 210 having an output of 32,771.410541 Hz. Binary scaled integer arithmetic, e.g., using a 32 bit accumulator 1110 as discussed above with reference to FIGS. 11 and 12, may be used so that a first 16 bits represent the integer portion 1301, a second 16 bit represents the fractional portion 1302, resulting in a new dither count 1303. In the illustrated embodiment, 16 bits of fraction are carried, and the input frequency of 32,771.410541 Hz is multiplied by $2^{16}$ ($2^{16}$ is 65536), resulting in a value 2147707161. In this representation, the number is scaled by 65536, so that it represents the number 32,771.4105377197. There is a small error compared to 32,771.410541 Hz), which is due to the inability to exactly represent decimal numbers using 16 bits of binary fraction. Embodiments advantageously achieve less than one part per billion of computational precision.

In the illustrated embodiment, a 16-bit fraction provides 1/65536 of one integer count, which is nominally 1 count of 32,768. This combines to provide 1 part in $2^{31}$, which is a computational precision of 0.46 parts per billion. Embodiments may also be applied using more or fewer bits of binary fraction if more precision is required, or less precision is acceptable. Further, embodiments may involve rounding when converting the original decimal number to a binary scaled integer to minimize error.

Embodiments using scaled integer arithmetic are particularly suitable since they are typically fast and efficient compared to other formats, thereby conserving power. However, in alternative embodiments, other number representations and/or formats may be utilized. For example, embodiments may be implemented using floating point number representations. Thus, embodiments advantageously provide methods and systems for compensating for offsets of oscillators more accurately than known systems and methods. In addition to compensating for offset, alternative embodiments may also provide for compensation as a result of temperature variations and aging.

Temperature Compensation

Figure 1A:
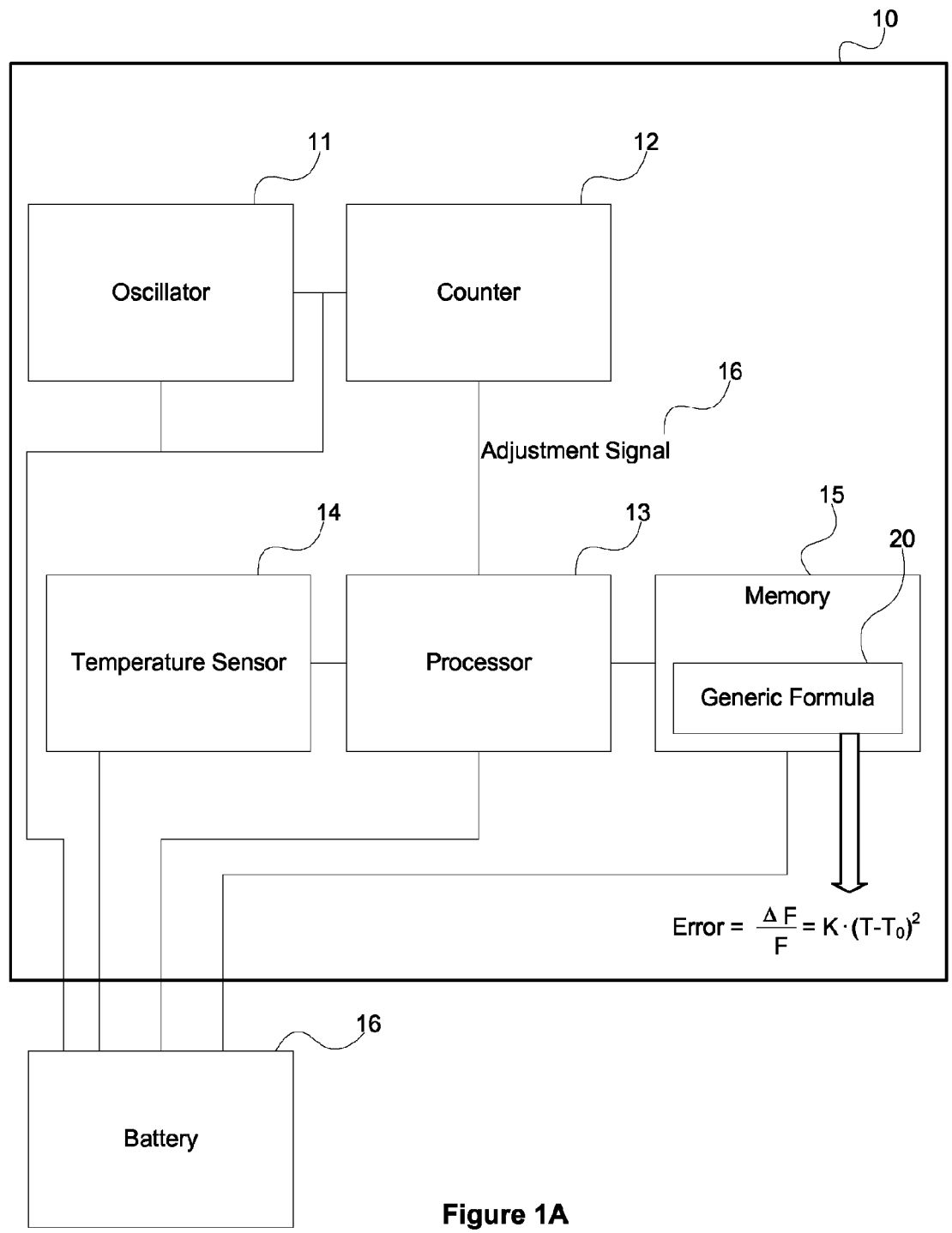
FIG. 1A illustrates a known RTC system that compensates for temperature effects on the frequency of an output of an oscillator using a generic temperature compensation formula that applies to other oscillators.
Figure 1B:
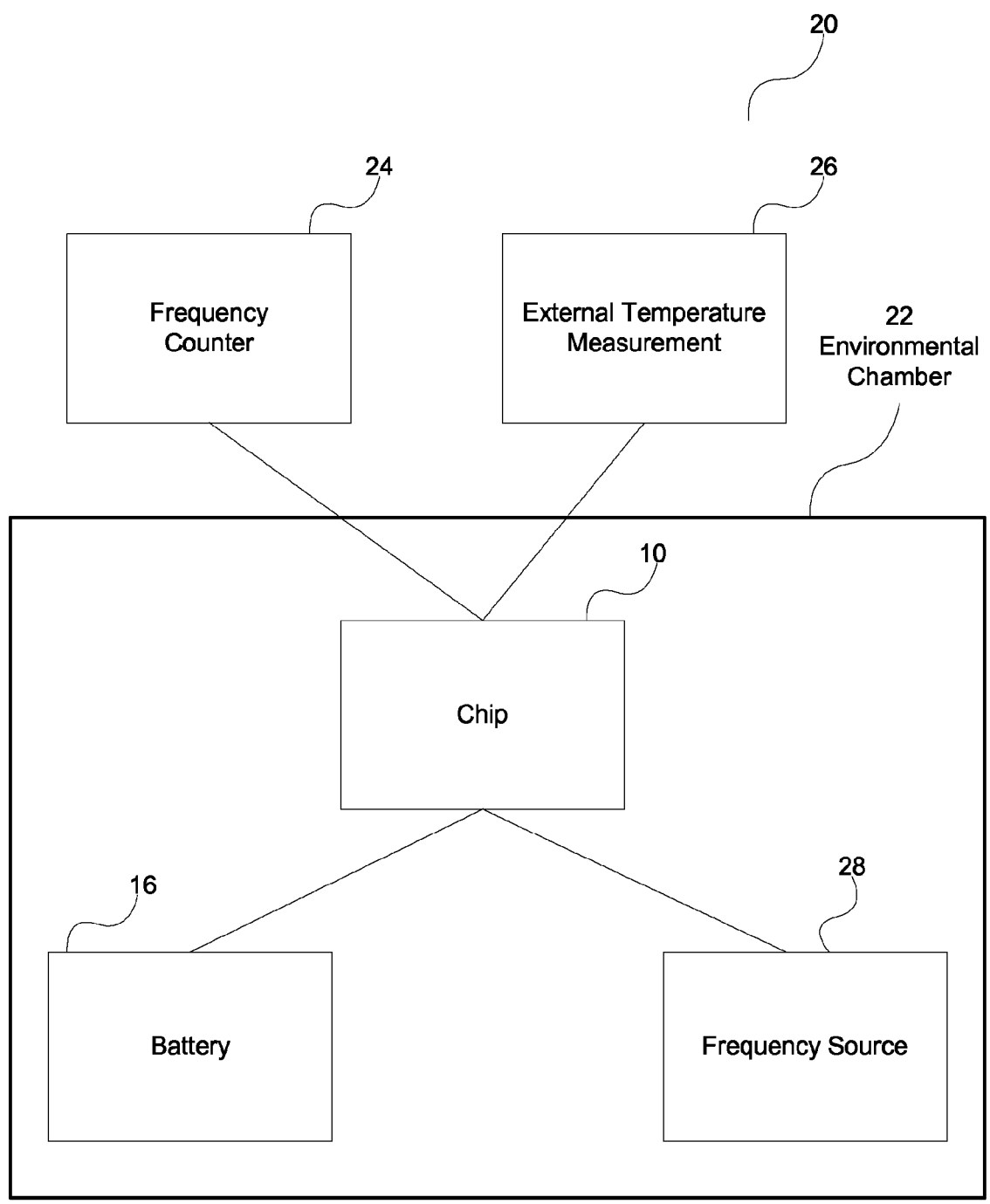
FIG. 1B illustrates a known calibration system for determining variations of an output of an oscillator at different temperatures using an off-chip or external temperature measurement element.
Figure 14:
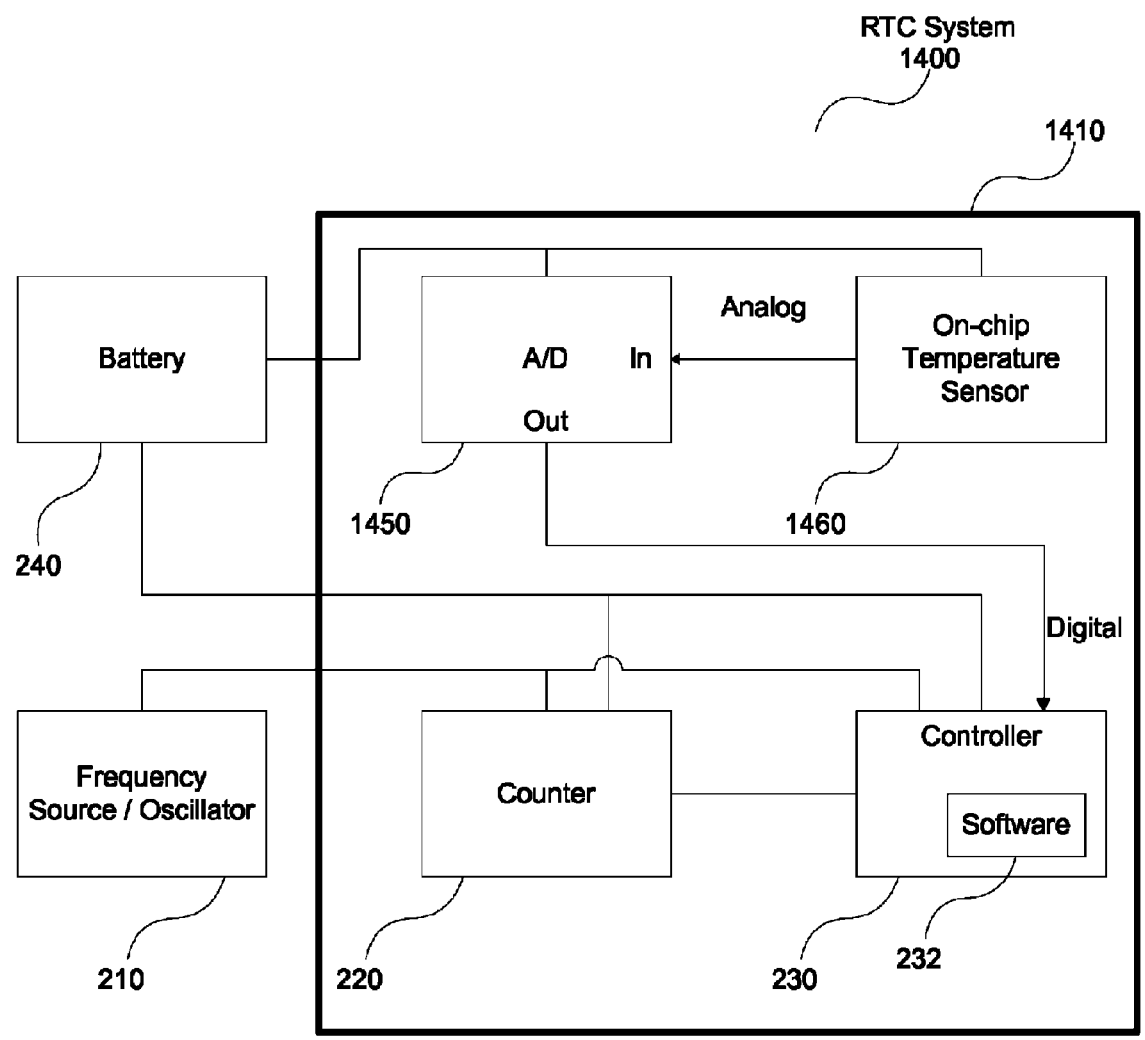
FIG. 14 illustrates an exemplary embodiment of a RTC system in the form of a chip, integrated circuit, or module that utilizes an on-chip temperature measurement element during calibration.
Figure 15:
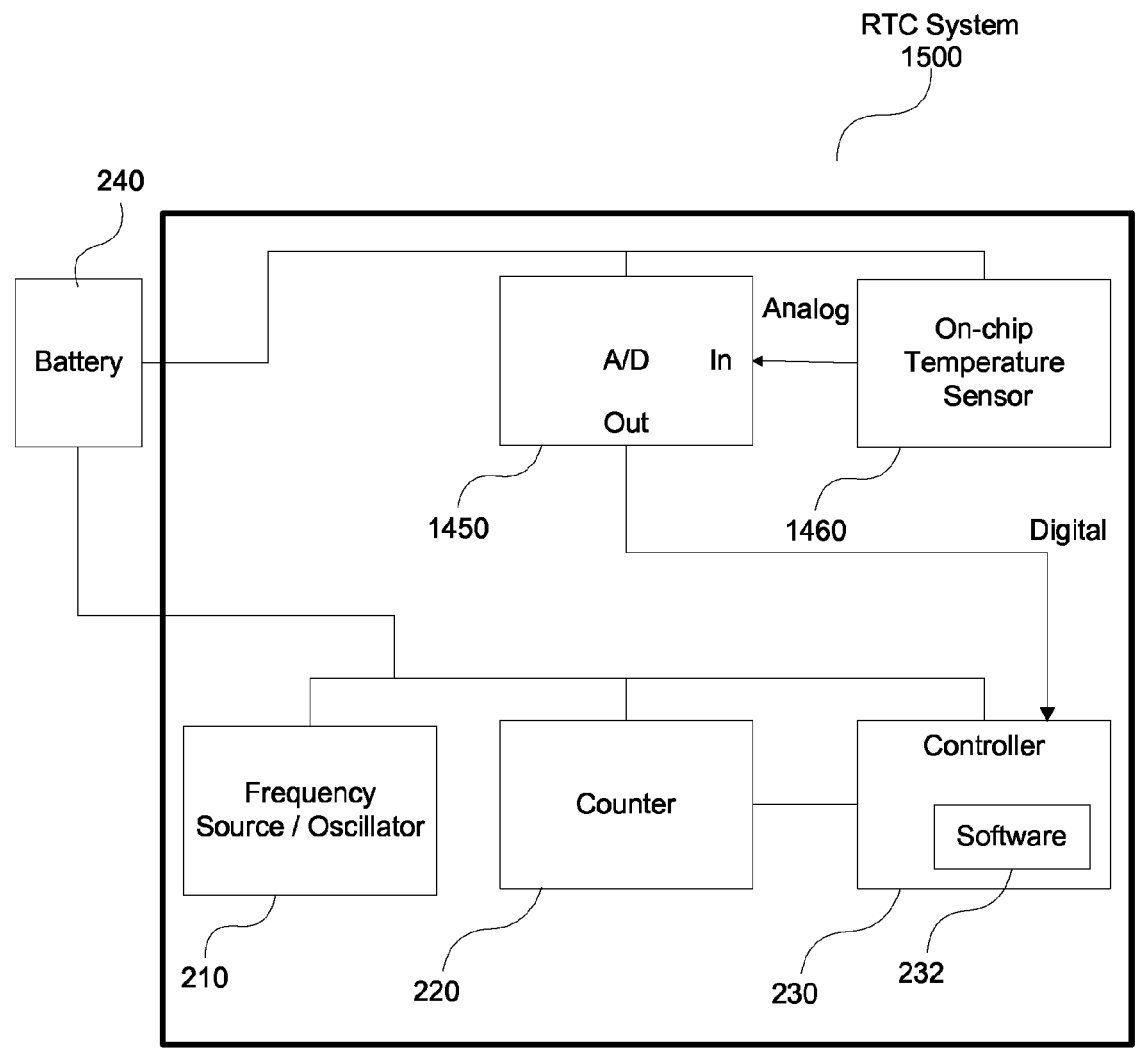
FIG. 15 illustrates another configuration of a RTC system for use in various embodiments during calibration.
Figure 16A:
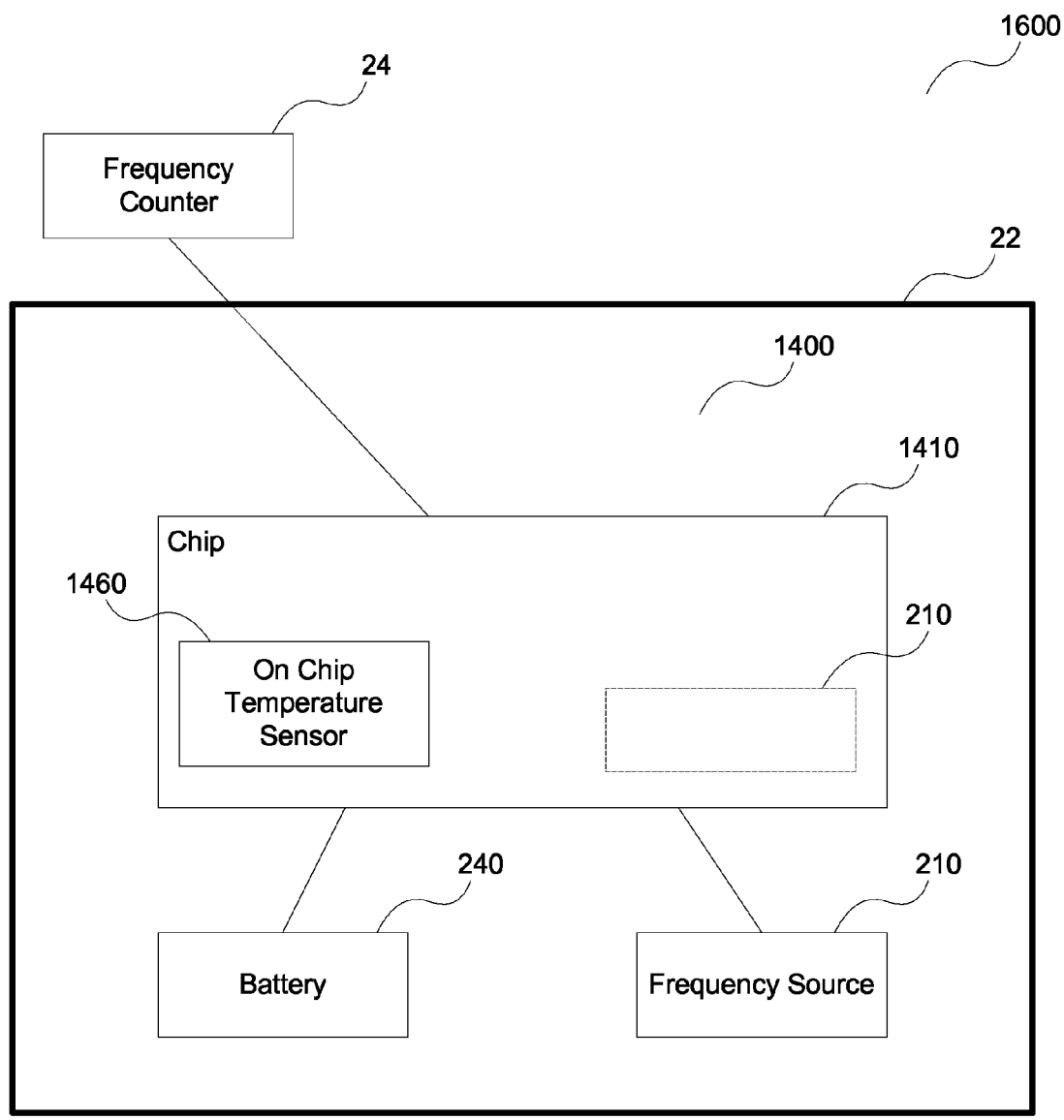
FIG. 16A illustrates a calibration system including an external frequency counter and an internal or on on-chip temperature measurement element for use in various embodiments.
Figure 18A:
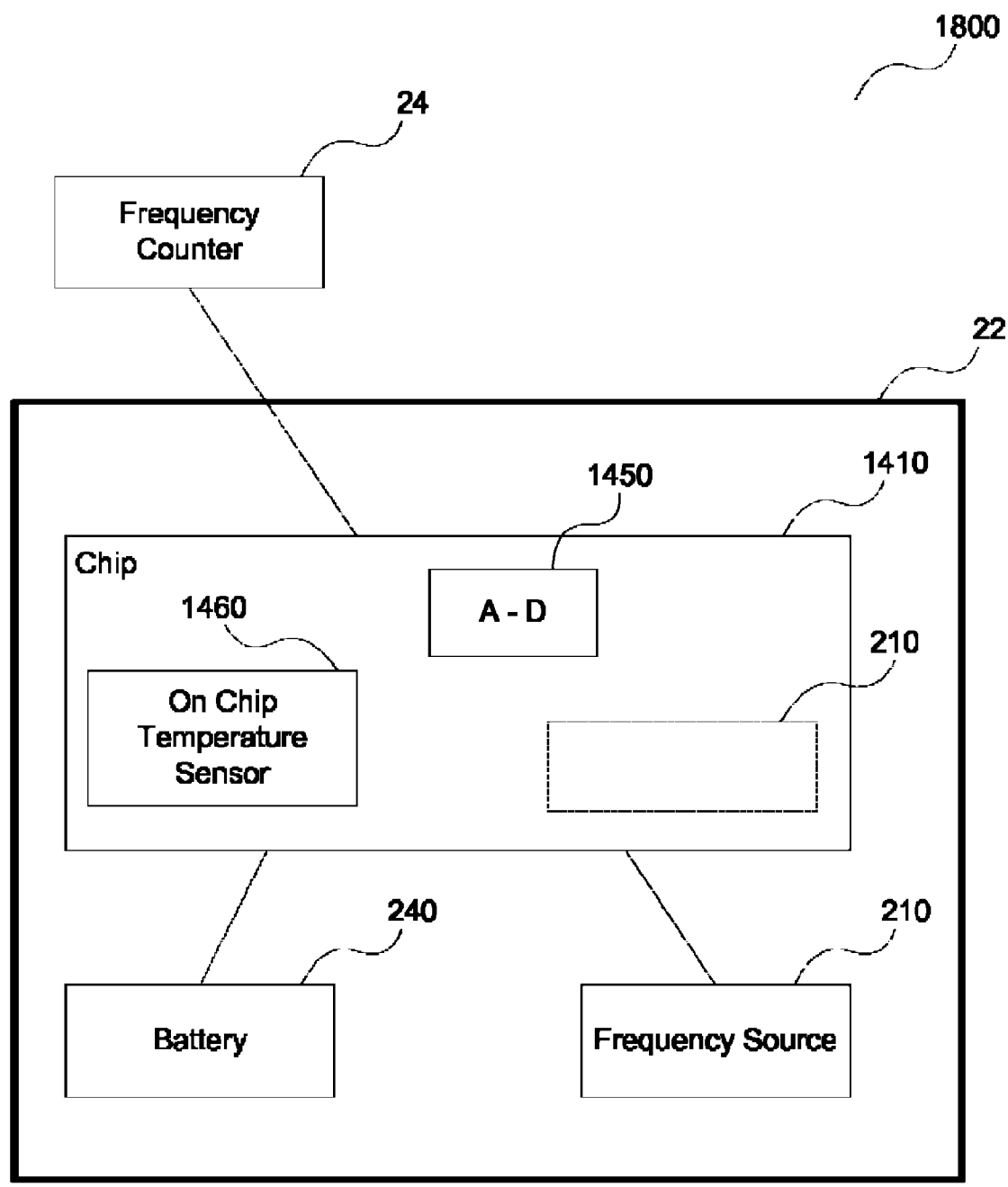
FIG. 18A illustrates a calibration system according to another embodiment that includes an external frequency counter, an on-chip temperature measurement element, and an on-chip analog-to-digital converter.
Figure 19:
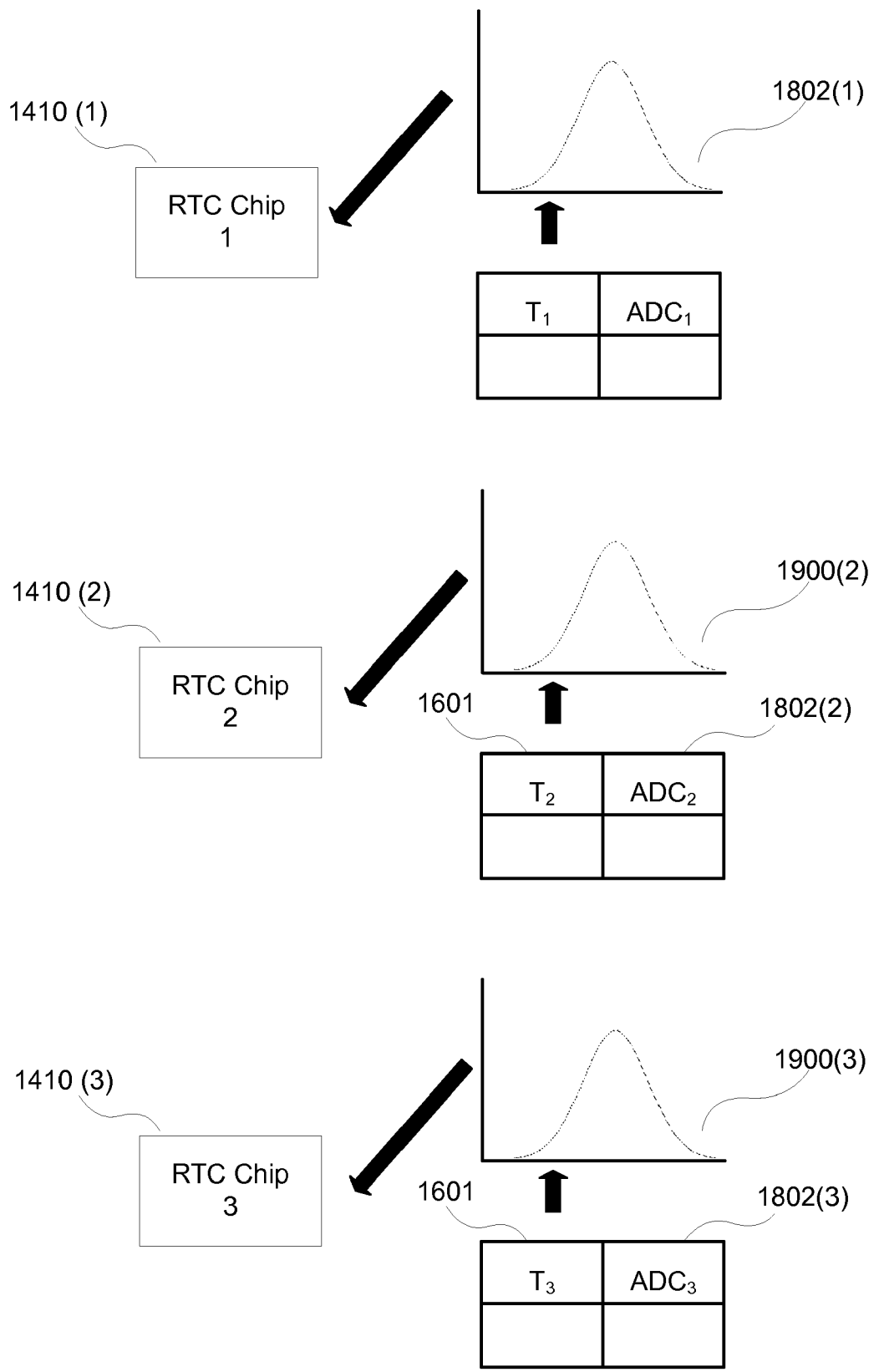
FIG. 19 illustrates multiple RTC chips being programmed with customized curve fit functions derived from the actual performance of the chips at different temperatures as determined using an on-chip analog-to-digital converter and an on-chip temperature measurement element.

Embodiments may also advantageously utilize an on-chip or internal temperature measurement element rather than an off-chip or external temperature measurement element during calibration in order to reduce or eliminate errors associated with that external data. Embodiments may also eliminate the use of the same generic temperature compensation formula 20 (as shown in FIG. 1) so that different RTCs may be programmed with their own temperature compensation formulas or profiles. In one embodiment, these advantages may be achieved using customized curve fitting, the results of which are programmed into respective RTC chips so that each RTC chip has a customized temperature compensation formula. In another embodiment, these advantages may be achieved by curve fitting data from an analog-to-digital converter (ADC), which converts analog temperature data into digital data, which is then processed to generate temperature compensation outputs. In these embodiments, temperature compensation adjustments may be made based on digital data and without actually knowing the temperature. FIGS. 14 and 15 illustrate components of an RTC system or chip that utilizes an on-chip temperature measurement element. FIGS. 16A-17 illustrate one embodiment of generating custom curve fit functions for individual RTCs based on data acquired using a system including an external frequency counter and an internal or on-chip temperature measurement element, and FIGS. 18A-19 illustrate one embodiment of generating custom curve fit functions for individual RTCs based on data acquired using an external frequency counter, an on-chip ADC, and an on-chip temperature measurement element.

Referring to FIG. 14, a RTC system 1400 may include a chip, an IC or a module 1410 (generally "chip 1410"), a battery 240, and a frequency source or oscillator 210. The chip 1410 may include a counter 220, a controller or processor 230, an on-chip A/D converter 1450, and an on-chip temperature measurement element 1460. As shown in FIG. 15, a RTC system 1500 may include an on-chip frequency source or oscillator 210. The ADC 1450 may or may not be used depending on which embodiments are utilized. Thus, while various embodiments may use the same chip 1400, certain embodiments may use only certain components of the chip 1400.

Referring to FIG. 16A, a calibration system 1600 according to one embodiment includes a RTC system, such as the system 1400 shown in FIG. 14 or the system 1500 shown in FIG. 15, which is placed inside an environmental heating/cooling chamber 22. The chamber 22 is cycled through different temperatures so that the chip 1410 and frequency source or oscillator 210, whether on the chip 1410 (FIG. 14) or off of the chip 1410 (FIG. 15), are at various temperatures. The temperatures of the frequency source 210 at the different temperatures are measured by the on-chip or internal temperature measurement element 1460 or other suitable on-chip device, thus disposing of the need for an external temperature measurement element 26 (as with known calibration systems). The frequency counter 24 determines the frequency of the output of frequency source 210 at each temperature as measured by the on-chip temperature measurement element 1460. The temperature and output frequency data may then used to generate a curve or function that represents the data and the actual variations of the frequency source 210 at different temperatures. The generated curve or function may then be stored to a controller or memory of the chip 1410 so that the appropriate temperature adjustments may be made based on actual changes of the output of the frequency source 210 at different temperatures during use of the chip 1410 rather than using a generic temperature compensation function that may not reflect actual frequency source 210 performance at different temperatures as accurately as the generated curve function.

For example, FIG. 16B is a table of exemplary data acquired using the system configuration illustrated in FIG. 16A. The first column 1601 represents the temperature inside the environmental chamber 22. In the illustrated embodiment, the environmental chamber 22 was set to twenty six (26) different temperatures ranging from −40.6° C. to 87° C. The second column 1602 represents the frequency that was measured by the frequency counter 1510 at each of the twenty six (26) different temperatures. The third column 1603 represents the frequency as calculated using the known generic temperature compensation formula 20 (FIG. 1) at each temperature, i.e., using Error=$\Delta F/F=K^*(T-T_0)^2$. The fourth column 1604 represents the parts per million (PPM) error resulting from use of the known generic temperature compensation formula 20. The fifth column 1605 represents the frequency values calculated using the determined curve fit function. A curve fit may be performed on the acquired data to improve precision and to provide a method that combines offset correction and temperature correction. The sixth column 1606 represents the PPM error resulting from use of curve fitting according to one embodiment. Significantly, comparing column 1604 (error resulting from use of the known generic formula 20) and column 1606 (error resulting from curve fit embodiment), the error values using curve fit embodiments are significantly lower than the error values resulting from use of the generic formula 20.

In this example, the frequency values in column 1605 were calculated using a second order curve fit polynomial:

$$\text{Predicted frequency} = at^2 + bt + c,$$

where:
 a=constant (in this example, a=$-1.175238296 \times 10^{-3}$),
 b=constant (in this example, b=0.0538246957),
 c=constant (in this example, c=$3.2767467188 \times 10^4$), and
 T=temperature (° C.).

Thus, in this embodiment, the curve fit combines offset correction and temperature correction and may be used regardless of temperature units, regardless of the manner in which frequency is measured, whether directly, by using time measurements and converting to frequency, or by other methods in which frequency is deduced or derived from a measurement, and regardless of whether the curve fit is performed on frequency data or data that is derived from frequency data, such as period (time) data. Embodiments may also be utilized regardless of whether or not the offset correction is combined into the curve fit.

For example, a different and equally valid set of constants result from curve fitting the following polynomial:

$$\text{Predicted frequency} = \text{offset} + at^2 + bt + c,$$

where:
 offset=32,768 or any other constant, as desired.

Embodiments are equally valid with more or fewer polynomial terms in the curve fit if more precision is required, or less precision is acceptable. Further, embodiments may be used if powers of temperature other than 0, 1, and 2 are used in the curve fit and if different functions other than polynomials are used in the curve fit, or if polynomials and non-polynomial functions are combined in the curve fit. Further, although FIG. 16B illustrates 26 temperature and frequency data points, embodiments may be implemented using more or less data points in order to generate a curve fit with desired accuracy.

Figure 17A:
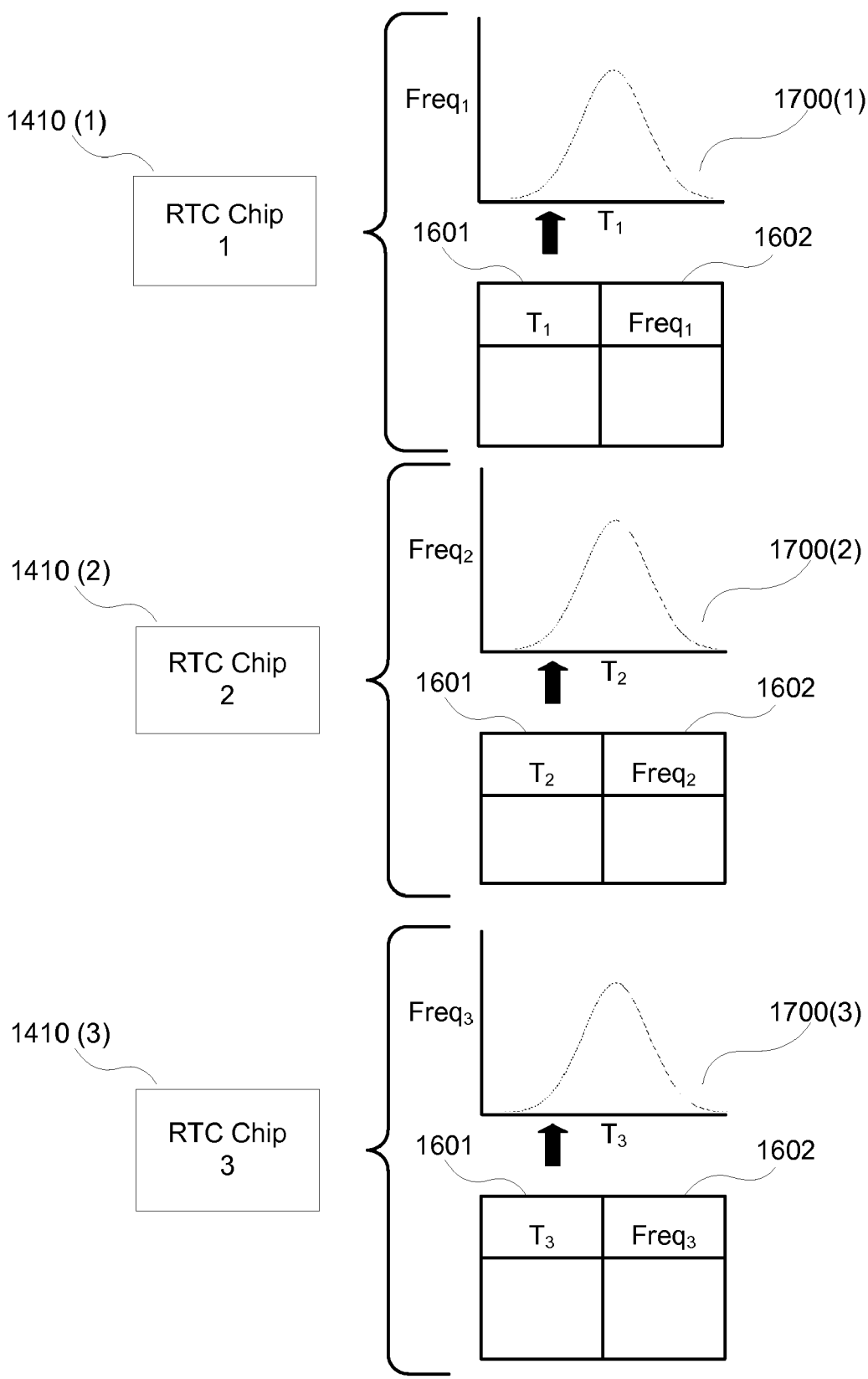
FIG. 17A illustrates multiple RTC chips being programmed with customized curve fit functions derived from the actual performance of the oscillators at different temperatures as determined using on-chip temperature measurement elements during calibration according to one embodiment.
Figure 17B:
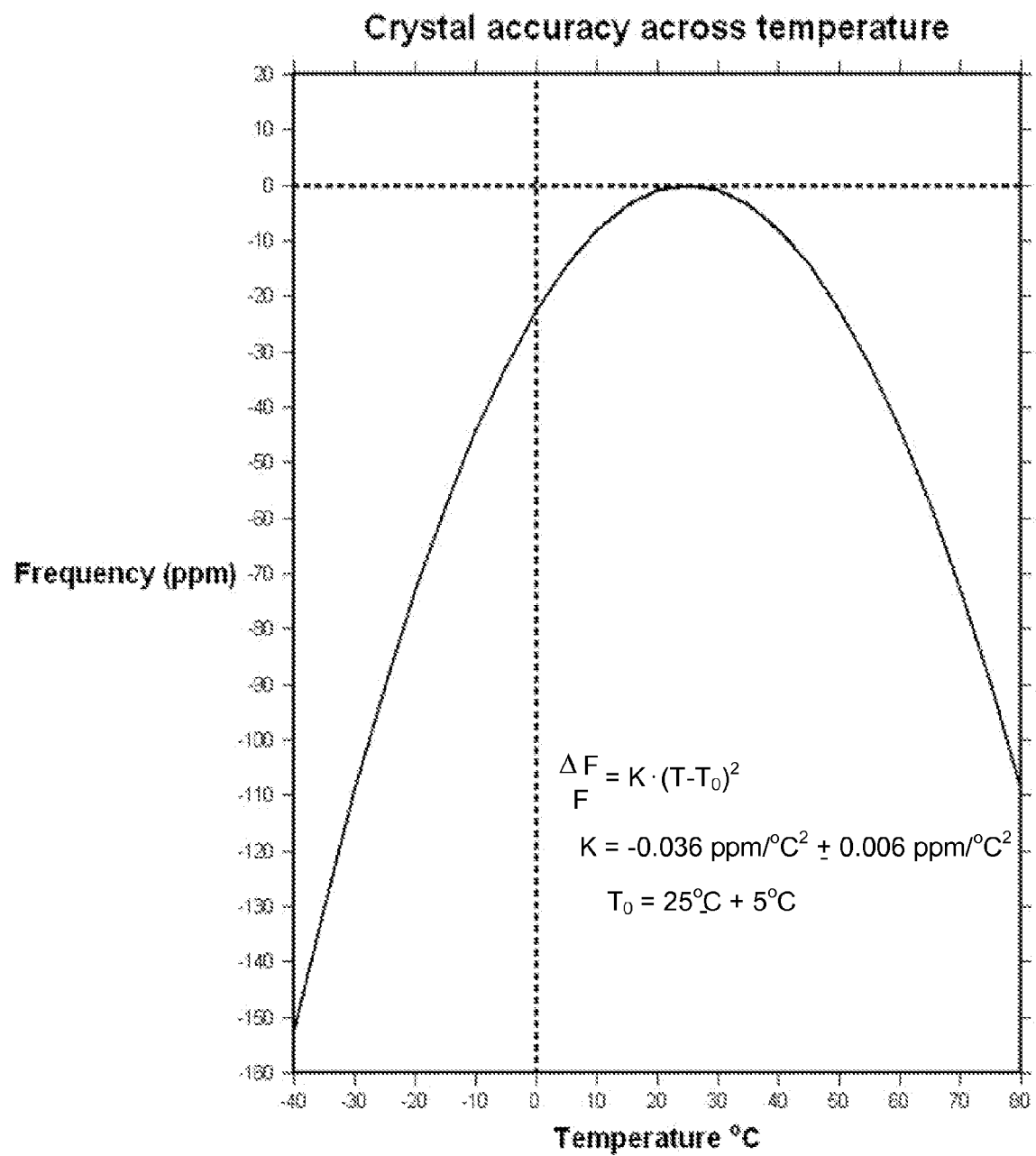
FIG. 17B is an exemplary customized curve fit that may be used to program an RTC chip.

Referring to FIG. 17A, multiple RTC chips (Chips 1-3 are shown for purposes of illustration) may be calibrated using an external frequency counter 1510 and respective on-chip temperature measurement elements 1460 so that a customized curve fit 1700(1-3) (generally "curve fit 1700") is obtained for each individual chip 1410 based on measured temperature and frequency data 1601 and 1602. An exemplary customized curve is shown in FIG. 17B. As a result, each chip 1410 may be associated with its own individual curve fit or curve fit function 1700, thereby advantageously providing temperature compensation based on the actual response of the frequency source or oscillator 210 at different temperatures rather than based on a generic temperature formula 20 that may not provide sufficient compensation.

Referring to FIG. 18A, another embodiment of a calibration system 1800 is shown for compensating for temperature using both an on-chip ADC 1450 and an on-chip temperature measurement element 1460. In this embodiment, the RTC chip 1410 may be placed in the environmental chamber 22, which is cycled through various temperatures. The frequency of the output of the frequency source or oscillator 210 is measured at each temperature by the frequency counter 24. For this purpose, the temperature data is data as measured by the on-chip temperature measurement element 1460 rather than an external element 26 (such as that shown in FIG. 1B). The analog temperature data as determined by the on-chip temperature measurement element 1460 is provided to the on-chip ADC 1450, which converts the analog temperature data into digital data. The digital data generated by the ADC 1450 is then used to generate a curve or function that represents the data and the actual variations of the chip 1410 at different temperatures. The generated curve or function may then be stored to a controller or memory of the chip 1410 so that the appropriate temperature adjustments may be made based on actual changes of the output of frequency source or oscillator 210 at different temperatures during use of the chip 1410 rather than using a generic temperature compensation function that may not reflect actual chip performance at different temperatures as accurately as the generated curve fit function. More particularly, the analog output of the temperature sensor 1460 is provided as an input to the ADC 1450, which converts the analog data to digital data (e.g., "counts"). The digital counts are provided to the controller 1430. The counts at various temperatures are used to generate a curve fit of temperature and ADC 1450 count data.

FIG. 18B is a table of data acquired using the system configuration illustrated in FIG. 18A. The first column 1801 represents the temperature inside the environmental chamber 22. In the illustrated embodiment, the environmental chamber was set to twenty six (26) different temperatures ranging from −40.6° C. to 87° C. The second column 1802 represents the number of ADC 1450 counts. The third column 1803 is the frequency measured by the external frequency counter 24. The fourth and fifth columns 1805 and 1806 include data from FIG. 16B, which shows how curve fit embodiments provide significant improvements over use of generic temperature compensation formulas 20 (FIG. 1). The sixth column 1806 represents the frequency values calculated using the determined curve fit function based on ADC 1450 data. The seventh column 1807 represents the PPM error resulting from use of curve fitting based on ADC 1450 data according to one embodiment.

As shown in FIGS. 16B and 18B, the embodiment that generates curve fit functions based on ADC 1450 data provides improvements over embodiments that generate curve fit functions that do not use the ADC 1450. The improvements of using embodiments that generate curve fit functions based on ADC 1450 data are readily apparent when comparing column 1807 to column 1604 in FIG. 16B, which represents the PPM error resulting from using the prior art generic temperature compensation formula 20.

In this particular example, the polynomial used for the curve fit was:

$$\text{Predicted frequency} = at^2 + bt + c,$$

where:
a=constant ($-7.5517404804 \times 10^{-7}$),
b=constant (0.0175883854),
c=constant ($3.2665665419 \times 10^4$), and
t=temperature in ADC counts.

Thus, embodiments advantageously may utilize temperature measurements obtained by an on-chip temperature element 1460 and a curve fit that combines offset correction and temperature correction. Embodiments may be used regardless of the precision of the temperature ADC conversion. For example, more or fewer bits of precision may be used if more precision is required, or less precision is acceptable. Further, embodiments may be used regardless of how frequency is measured, whether directly, or by using time measurements and converting to frequency, or by any other method in which frequency is derived from some measurement, or deduced. Additionally, embodiments may be used regardless of whether the curve fit is performed on frequency data or any data that is derived from frequency data, such as period (time) data. Embodiments may also be used regardless of whether or not the offset correction is combined into the curve fit or not.

For example, a different set of constants may be used and result from curve fitting the following example polynomial:

$$\text{Predicted frequency} = \text{offset} + at^2 + bt + c,$$

where:
offset=32,768 or any other constant, as desired.

This embodiment is also valid with more or fewer polynomial terms in the curve fit if more precision is desired, or less precision is acceptable. Further, embodiments may be used if powers of the temperature ADC other than 0, 1, and 2 are used in the curve fit. Moreover, embodiments may be used if different functions other than polynomials are used in the curve fit, or if polynomials and non-polynomial functions are combined in the curve fit.

Referring to FIG. 19, multiple RTC chips (Chips 1-3 are shown for purposes of illustration) may be calibrated using an ADC 1450 so that a curve fit 2000(1-3) (generally "curve fit 1900") is obtained for each individual chip 1410 based on measured temperature and ADC data 1601 and 1802. As a result, each frequency source or oscillator 210 on or associated with each chip 1410 may be associated with its own individual curve fit 1900, thereby providing advantageous temperature compensations based on the actual response of the frequency source 210 at different temperatures rather than based on a generic temperature formula 20 (FIG. 1A) that may or may not be relevant or have the desired level of accuracy. Following calibration and curve fit determinations, individual RTC chips 1410 and attached or associated frequency sources 210 may be used with customized temperature compensation.

It should be understood that the systems, methods and curve fit functions described above with reference to FIGS. 14-19 may based on different numbers of data points. Curve fit functions may be generated based on fewer temperatures. Alternatively, curve fit functions may be generated based on more temperatures if greater accuracy is desired. Thus, the example involving 26 temperatures is provided as one example of how embodiments may be implemented. Further, it should be understood that curve fit functions may be higher order functions if greater accuracy is desired. Further, embodiments may be implemented on a small scale or on a large scale during the production of many RTCs. Thus, embodiments may be implemented in various manufacturing and calibration environments.

Age Compensation

Figure 20:
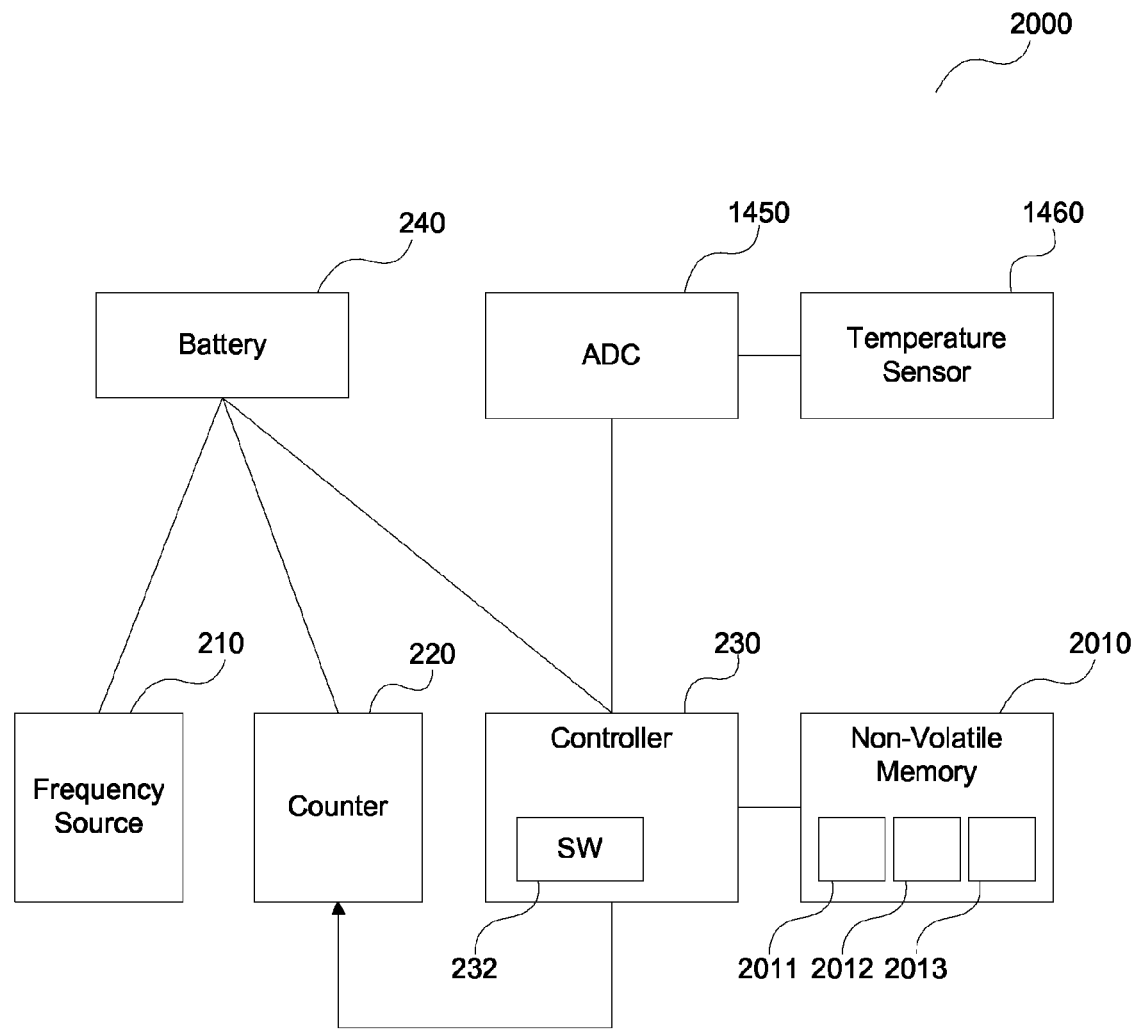
FIG. 20 illustrates another exemplary embodiment of a system that includes non-volatile memory for tracking an age of a device.

Referring to FIGS. 20 and 21, another embodiment of a system 2000 is shown that generally includes components as discussed above and a non-volatile memory 2010 such as flash memory. The non-volatile memory 2010 may, for example, be included within the controller 230 or external to the controller 230 (as shown in FIG. 20). Embodiments that utilize non-volatile memory 2010 (e.g., flash memory) may be used for counting events, e.g., a number of on-off cycles for a RTC and for keeping track of time. One example is an hour-meter that tracks the "age" of a device while avoiding erase cycle limitations of flash memory. According to one embodiment, a region of non-volatile memory 2010 is allocated that is initially erased (e.g., contains all one-bits). For each count, a one-bit is changed to a zero-bit. This embodiment is otherwise referred to as the "sliding-zeros" method.

As shown in FIGS. 20 and 21A-F, non-volatile memory 2010 may be divided into a number of regions, e.g., three non-volatile memory regions 2011, 2012, and 2013 (generally region 2011). In the illustrated embodiment shown in FIGS. 21A-F, each region 2011 is eight (8) bits in length, and the least significant two regions are separately erasable. In other words, when each region 2011 is erased, no other non-volatile memory region is affected. Initially, each region 2011 has a "1" value (shown in binary). For each count, a one-bit is changed to a zero-bit. A terminal count in a region 2011 may be defined as the number of bits contained within the region 2011, but other terminal counts may be utilized.

With multiple non-volatile memory regions, as one region reaches its terminal count, it is erased, and another non-volatile memory region counts once by changing a single one-bit to a zero-bit. Two or more regions 2011 may be cascaded to create a large number of possible combinations, which allows for increasing granularity (as would be useful in counting smaller units of time) and/or a larger count (as would be useful in counting a larger total elapsed time).

When multiple non-volatile memory 2011 regions are allocated, they may be considered to be ordered by significance, similar as to how a decimal number would be ordered, where left-most digits are more significant than right-most digits. If "n" non-volatile memory regions 2011 are allocated, then (n−1) non-volatile memory regions 2011 must be separately erasable. That is, all but one non-volatile memory 2011 region must be erasable, and when a non-volatile memory region 2011 region is erased, no other non-volatile memory 2011 region can be affected.

For example, referring to FIG. 21A, assume three non-volatile memory regions 2011, 2012, and 2013 (generally region 2011) are defined. In the illustrated embodiment, each region 2011 is eight (8) bits in length, and the least significant two regions are separately erasable. In other words, when each region 2011 is erased, no other non-volatile memory region is affected. Initially, each region has a "1" value (shown in binary).

Referring to FIG. 21B, after the first count, one region (e.g., region 2013) may change one of the "1" bits to a "0" bit to represent count=1.

Referring to FIG. 21C, as counting continues, the region 2013 may include additional "0" bits that replace "1" bits to represent count=2; count=3; count=4; count=5; count=6; count=7.

Referring to FIG. 21D, as the terminal count is reached in a non-volatile memory region (e.g., region 2013), that region 2013 is erased, and the next most significant region 2012 counts once to represent count=8.

Referring to FIG. 21E, normal counting continues by changing "1" bits to "0" bits in region 2113 to represent count=9; count=10; count=11 and count=12.

Referring to FIG. 21F, as the terminal count is simultaneously reached in several non-volatile memory regions 2012 and 2013 when count=64, those regions 2012 and 2013 are erased, and the next most significant region 2111 counts once when count=65.

Counting continues until the terminal count is simultaneously reached in all non-volatile memory regions 2011-2013 (or 2013n if additional memory regions are utilized). A user may decide if the sliding-zeros counter halts or rolls over by erasing all non-volatile memory regions. In the case where the counter rolls-over and all regions are erased, all regions may be erasable.

According to one embodiment, non-volatile regions 2011-2013 are the same size (as described above). In an alternative embodiment, the non-volatile memory regions may be different sizes. For example, in one embodiment one region may include 512 bytes (4096 bits) and another region may include 128 bytes (1024 bits). Further, non-volatile memory regions may or may not be contiguous memory within the region. Additionally, each non-volatile memory region may or may not be contiguous with other non-volatile regions.

Within a non-volatile memory region, "one" bits may be changed to "zero" bits in various orders. Further, in alternative embodiments, the erased state of the non-volatile memory may be "zero" in which case counting occurs by changing "zero" bits to "one" bits instead of changing "one" bits to "zero" bits. Thus, the embodiments shown in FIG. 21A-F, in which "one" bits change to "zero" bits in a manner that shifts occur from left to right, are provided for purposes of explanation and illustration to show, by example, one manner in which embodiments may be implemented.

According to one embodiment, non-volatile memory 2010 is flash memory. With flash memory, there is no life-cycle penalty for changing one-bits to zero-bits, but there is a life-cycle penalty for flash erase operations (for example, a particular flash memory might have an erase-cycle limit of 100,000 erase operations). In other embodiments, other types of non-volatile memory 2110 may be utilized if bits can be changed to their opposite state, and in the case of multiple allocated non-volatile memory regions, at least (n−1) regions are erasable.

A further embodiment is directed to a method for recording age using non-volatile memory 2110 so that an aging correction may be performed. If the age is known, aging error may be computed using an appropriate formula or method, e.g., a formula that is developed or supplied, or a custom formula.

According to another embodiment, a 32-bit sliding-zeros counter, a 1024-bit sliding-zeros counter, and a 16-bit RAM binary counter are used to record accumulative runtime. The 16-bit RAM binary counter counts seconds up to 65535 seconds, then rolls over to zero. The roll-over causes one count on the 1024-bit sliding-zeros counter. When the 1024-bit sliding-zeros counter reaches terminal count, it is erased, and the 32-bit sliding-zeros counter counts once. The combination of 65536*1024*32 seconds allows a device life up to 68.096 years to be tracked. The 16-bit RAM binary counter accounts for 18.20 hours of time, so that if power is removed from the system, a maximum of 18.20 hours is lost. This amount of time is reasonable in an RTC application where there is a battery backup that is intended to provide backup power for more than seven (7) years. Further, in this example configuration, the most significant sliding-zeros counter is not erased. This allows the sliding-zeros counter to co-exist in code space, if necessary. This may be particularly beneficial if non-volatile memory is scarce. Persons skilled in the art will appreciate that other system configurations may be used, e.g., counting some unit of time other than seconds, using a larger, smaller, or no RAM binary counter, using sliding-zeros counters of different sizes, or using more or fewer sliding-zeros counters.

Power Conservation

Another embodiment is directed to a method for using an unpacked floating point format to minimize code space and reduce software overhead, thereby conserving power and extending battery life. While it is possible to use scaled integer arithmetic to perform the offset, temperature, and aging correction computation, the processor storage size and operation precision may be selected so that each part of the computation does not overflow, underflow, or suffer unacceptable loss of significance. Considering that error corrections are performed on a reasonably slow schedule, one embodiment uses floating point arithmetic for these computations.

On some processors, including those without direct hardware support for floating point operations, a standard floating point library may be so large that the software build may exceed the available code space limit of the selected processor.

The normal IEEE floating point format requires the software floating point library to unpack the < sign, exponent, and mantissa > into its component pieces before the requested operation may be performed, such as multiply or add, then the result is repacked into the IEEE floating point format. This packing and unpacking requires instructions to be executed, which consumes power. To reduce or minimize computational effort, custom floating point functions may be created using an unpacked storage format. Custom functions may be small enough to fit in the software build without exceeding the code space limit of the selected processor. The unpacked format saves instruction execution, which conserves power. The unpacked format may also carry additional bits for extra precision (32-bits, for example, compared to the IEEE standard of 24-bits). Further, custom floating point routines need only provide support for the required operations, thereby reducing the software footprint. In the case of offset and temperature correction, only multiply and add are required.

In another embodiment, the temperature and offset correction may be factored to reduce the number of arithmetic operations, thereby conserving power. The temperature and offset correction formula may be expressed as:

Predicted frequency=$at^2+bt+c$, where:
a=constant,
b=constant,
c=constant, and
t=temperature.

The total number of computations is three multiplies and two adds. Factoring the above formula results in:

Predicted frequency=$(at+b)t+c$, so that there are only two multiply and two add operations, thereby conserving power.

The sequence of operations used in computing the temperature and offset correction allows a dramatic optimization in the custom floating point multiply function. If the factored temperature and offset correction formula is used:

Predicted frequency=$(at+b)t+c$, and ADC values are used (16-bits or less), then the multiplier is 16 bits or less. Thus, rather than performing a generic 32 by 32 multiply in the custom floating point multiply function, a 32 by 16 multiply may be performed instead, which may reduce the computational effort by fifty percent (50%), thereby conserving power.

Additional power may be saved by implementing an early-out algorithm whereby as soon as all the one-bits in the multiplier have been used, the algorithm stops. Assuming a 10-bit temperature ADC, for example, this would result in a 32 by 10 multiply, or smaller, depending upon the number of one-bits in the multiplier, thereby conserving power.

This embodiment may be used if other units of temperature are used, such as temperature in degrees Celsius, or temperature in degrees Fahrenheit, or temperature in degrees Kelvin, or any unit of temperature, and if scaled temperature values are used, such as ADC temperature shifted left or right, or temperature in expressed in tenths of a degree C., degree F., or degree K, or 256-ths of a degree C., degree F., or degree K, or any scaled representation of temperature in any unit of temperature.

Further, the temperature and offset correction allows a dramatic optimization in the precision of the computation. The computed offset and temperature correction may result in a predicted frequency near the nominal frequency of the frequency source. For example, using a frequency source of 32768, a ±120 ppm error would be somewhere near ±4 Hz, a range of 9 counts.

Continuing with this exemplary frequency source, for predicted frequencies >=32768, the binary representation is:

1000 0000 0000 00xx. xxxx xxxx xxxx xxxx, where 1 is always a 1, 0 is always a 0, and x represent the remaining binary digits.

Since fourteen of these digits are always the same, they contribute no useful precision in the result. By eliminating some or all of the leading digits, more bits of precision may be carried in the computation.

For predicted frequencies <32768, the binary representation is:

0111 1111 1111 11xx.xxxx xxxx xxxx xxxx.

Again, it is observed that the leading fourteen binary digits are always the same.

If an extreme of ±8 Hertz is assumed, and the base frequency is chosen to be 32760, and the fitting polynomial is chosen to be:

Predicted frequency=$32760+at^2+bt+c$, and the $at^2+bt+c$ portion will generate a small positive number in the range of 0<=$at^2+bt+c$<16. This allows an extra 12 bits of precision to be carried in the computation.

This method may be used with frequency sources other than 32,768 Hz oscillators, as a base frequency for the fitting polynomial may be chosen to ensure a small range of positive corrections to the chosen base frequency. Further, embodiments may be used with more or fewer polynomial terms in the curve fit if more precision is required, or less precision is acceptable. Additionally, embodiments may be used when powers of temperature other than 0, 1, and 2 are used in the curve fit and when using different functions other than polynomials in the curve fit, or if polynomials and non-polynomial functions are combined in the curve fit.

Additionally, the rate of change of temperature allows a dramatic reduction of computational effort involved in computing the offset and temperature correction, which may conserve power. A pool of temperature/offset corrections for recent temperatures may be maintained so that when the temperature is measured at runtime, the pool may be checked to determine if a result exists for that temperature. If a result exists, then the result may be immediately used without computational effort. If a result does not exist, the result corresponding to the temperature that is furthest away from the current temperature may be discarded from the pool, and the new temperature/offset correction may be computed and added to the pool.

For systems in which the temperature changes reasonably slowly and has a tendency to stabilize, these embodiments may result in a dramatic reduction in computational effort, which may conserve power. Because computation effort may be dramatically reduced, embodiments may allow temperature correction to be performed at more frequent intervals.

Persons skilled in the art will appreciate that embodiments described herein may be implemented in various electronic and computer or processing devices. For example, embodiments may be used in laptop and desktop computers, servers, personal digital embedded systems, wireless devices, mobile communications devices, global positioning devices (GPS) and other processing and communications devices that utilize or maintain dates and/or times.

Further, persons skilled in the art will appreciate that embodiments may be implemented in analog and digital circuitry and integrated circuit (IC) chips and using appropriate programming in various programming languages. Further, although embodiments have been described with reference to a particular oscillator frequency of 32.768 kHz, persons skilled in the art will appreciate that embodiments may be applied to other clock speeds and frequencies, and that a frequency of 32.768 kHz for computer-related applications is but one example of how embodiments may be implemented. Additionally, embodiments may be used individually or in combination as necessary or desired. For example, embodiments may be configured for only offset compensation, only compensation as a result of temperature, only compensation as a result of age, or a combination thereof, e.g., compensation for offset and temperature, compensation for offset and age, compensation for temperature and age, and compensation for offset, temperature and age. Thus, embodiments may be applied and configured to compensate for frequency variations from various sources or conditions.

In view of the forgoing, persons skilled in the art will appreciate a number of advantages and benefits provided by embodiments. For example, embodiments may enable a desired frequency to be approximated based upon a particular crystal oscillator's actual or predicted frequency to a high degree of precision. Further, embodiments may be capable of minimizing cumulative error in real-time to within one period of the frequency source (e.g. about 30.5 micro-seconds in the example involving a 32.768 kHz crystal oscillator). Additionally, embodiments may be capable of achieving less than one part per billion of computational precision in a fast and efficient manner. Further, embodiments may be capable of combining offset correction, temperature correction, and/or aging correction. Embodiments also may improve methods for predicting temperature and/or offset correction, and/or combining temperature and offset correction into a single method and system.

Further, embodiments may be used for counting events or time using a non-volatile memory, e.g., flash memory, while avoiding erase cycle limitations of flash memory. Embodiments may also be used to record the age of an oscillator device so that an aging correction may be performed. If battery backup is lost, the maximum loss of accumulative runtime may be about 18.2 hours (in one embodiment), and the maximum accumulative runtime is about 68.09 years (in one embodiment).

Embodiments may also use custom floating point routines that conserve space, increase precision, and/or conserve power. Temperature correction methods have been optimized to conserve power, and characteristics of temperature and offset correction may allow dramatic speed optimizations in floating point routines and in the computation precision.

Additionally, with embodiments, computational effort may be reduced while providing offset and temperature correction, thereby conserving power. Thus, embodiments enable temperature corrections at more frequency intervals if desired.

Further, embodiments may be combined to provide an integrated compensation solution. For example, in one embodiment, offset correction and temperature correction may be combined into a single formula or computation. This may be done on a per-unit basis or using statistical sampling on a large number of frequency sources.

Although particular embodiments have been shown and described, it should be understood that the above discussion is not intended to limit the scope of these embodiments. Various changes and modifications may be made without departing from the scope of the embodiments of the invention.

I claim:

1. A method for correcting offset of a real-time clock, comprising:
   determining a frequency of an output of an oscillator, the frequency being represented as an integer (i) portion and a non-integer (ni) portion; and
   counting a first number (a) of "i" oscillations and counting a second number (b) of "i+x" oscillations by dithering between "i" and "i+x" oscillations;
   wherein an average of the first number (a) of "i" oscillations and the second number (b) of "i+x" oscillations is an effective number of oscillations that is approximately the same as the determined frequency.

2. The method of claim 1, wherein x=1.

3. The method of claim 1, wherein x>1.

4. The method of claim 1, further comprising compensating for a frequency variation of the real-time clock caused by ambient temperature without knowing the ambient temperature.

5. The method of claim 1, wherein counting the second number (b) further comprises counting a second number (b) of "i+1" oscillations.

6. The method of claim 1, wherein counting the second number (b) further comprises counting a second number (b) of "i+2" oscillations.

7. The method of claim 1, wherein the first number (a) is greater than the second number (b).

8. The method of claim 1, wherein the second number (b) is greater than the first number (a).

9. The method of claim 1, wherein the first number (a) and the second number (b) are equal.

10. The method of claim 1, wherein all of the first number (a) of "i" oscillations are counted followed by all of the second number (b) of "i+x" oscillations.

11. The method of claim 1, wherein one of the first number (a) of "i" oscillations is counted followed by one of the second number (b) of "i+x" oscillations.

12. The method of claim 1, wherein "ni" is a fraction or a decimal.

13. A method for correcting offset of an oscillator of a real-time clock, comprising:
   determining a frequency of an output of an oscillator, the frequency being represented as an integer (i) portion and a non-integer (ni) portion; and
   counting a first number (a) of "i" oscillations and counting a second number (b) of "i+1" oscillations by dithering between "i" oscillations and "i+1" oscillations;
   wherein an average of the first number (a) of "i" oscillations and the second number (b) of "i+x" oscillations is an effective number of oscillations that is the same as or approximately the same as the determined frequency.

14. A method for correcting offset of an oscillator of a real-time clock, comprising:
   determining a frequency of an output of an oscillator, the frequency being represented as an integer (i) portion and a non-integer (ni) portion; and
   counting a first number (a) of "i" oscillations and counting a second number (b) of "i+1" oscillations by dithering between "i" oscillations and "i+x" oscillations;
   wherein a ratio of (first number (a)*i)+(second number (b)*(i+x)/(first number (a)+second number (b)) is an effective number of oscillations that is the same as or approximately the same as the determined frequency.

15. A real-time clock, comprising:
   a frequency source,
   a counter coupled to the frequency source and being configured to generate a count value based on an output of the frequency source; and
   a controller coupled to the counter and being configured to adjust the counter to reflect the actual output of the frequency source by reading the count value from the counter based on the actual output of the frequency source to determine an actual frequency of the output of the frequency source, the frequency being represented as an integer (i) portion and a non-integer (ni) portion, counting a first number (a) of "i" oscillations and counting a second number (b) of "i+1" oscillations by dithering between "i" oscillations and "i+1" oscillations, wherein a ratio of (a*i)+(b*(i+1)/(a+b) is the same as or approximately the same as the determined frequency.

* * * * *